(12) United States Patent
Kim et al.

(10) Patent No.: US 11,562,965 B2
(45) Date of Patent: Jan. 24, 2023

(54) SEMICONDUCTOR PACKAGE

(71) Applicant: SAMSUNG ELECTRONICS CO., LTD., Suwon-si (KR)

(72) Inventors: Sun Chul Kim, Hwaseong-si (KR); Sang Soo Kim, Cheonan-si (KR); Yong Kwan Lee, Hwaseong-si (KR); Hyun Ki Kim, Asan-si (KR); Seok Geun Ahn, Cheonan-si (KR); Jun Young Oh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/134,602

(22) Filed: Dec. 28, 2020

(65) Prior Publication Data

US 2021/0366834 A1  Nov. 25, 2021

(30) Foreign Application Priority Data

May 21, 2020  (KR) .................. 10-2020-0060791

(51) Int. Cl.

| | |
|---|---|
| *H01L 23/538* | (2006.01) |
| *H01L 23/13* | (2006.01) |
| *H01L 23/31* | (2006.01) |
| *H01L 21/78* | (2006.01) |
| *H01L 21/48* | (2006.01) |
| *H01L 21/56* | (2006.01) |

(52) U.S. Cl.
CPC ...... *H01L 23/5389* (2013.01); *H01L 21/4853* (2013.01); *H01L 21/565* (2013.01); *H01L 21/78* (2013.01); *H01L 23/13* (2013.01); *H01L 23/3128* (2013.01); *H01L 23/5385* (2013.01); *H01L 23/5386* (2013.01)

(58) Field of Classification Search
CPC ............ H01L 23/5389; H01L 21/4853; H01L 21/565; H01L 21/78; H01L 23/13; H01L 23/3128; H01L 23/5385; H01L 23/5386
See application file for complete search history.

(56) References Cited

U.S. PATENT DOCUMENTS

| | | | |
|---|---|---|---|
| 9,349,713 B2 | 5/2016 | Kim et al. | |
| 9,620,484 B2 | 4/2017 | Kim | |
| 10,361,177 B2 | 7/2019 | Kim et al. | |
| 2007/0158833 A1* | 7/2007 | Park ...................... | H01L 21/561 257/E21.705 |
| 2012/0146202 A1* | 6/2012 | Xue ...................... | H01L 21/561 257/676 |

(Continued)

FOREIGN PATENT DOCUMENTS

WO  WO-2006075197 A1 *  7/2006  ............. H01L 24/32

*Primary Examiner* — Fernando L Toledo
*Assistant Examiner* — Neil R Prasad
(74) *Attorney, Agent, or Firm* — F. Chau & Associates, LLC

(57) ABSTRACT

A semiconductor package includes a first substrate, a first semiconductor chip disposed on the first substrate, a second substrate disposed on the first semiconductor chip, a second semiconductor chip disposed on the second substrate, and a mold layer disposed between the first substrate and the second substrate. The second substrate includes a recess formed at an edge, the mold layer fills the recess, and the recess protrudes concavely inward from the edge of the second substrate toward a center of the second substrate.

20 Claims, 25 Drawing Sheets

(56) References Cited

U.S. PATENT DOCUMENTS

| | | |
|---|---|---|
| 2015/0340308 A1 | 11/2015 | Law et al. |
| 2018/0145061 A1 | 5/2018 | Jeong et al. |
| 2018/0277495 A1* | 9/2018 | Chiu .................. H01L 21/4857 |
| 2018/0374833 A1 | 12/2018 | Wong et al. |
| 2019/0139845 A1 | 5/2019 | Lin et al. |
| 2020/0098734 A1 | 3/2020 | Jeong et al. |
| 2020/0144162 A1* | 5/2020 | Chaowasakoo ......... H01L 24/84 |

* cited by examiner

SEMICONDUCTOR PACKAGE

CROSS-REFERENCE TO RELATED APPLICATION

This application claims priority under 35 U.S.C. § 119 from, and the benefit of, Korean Patent Application No. 10-2020-0060791, filed on May 21, 2020 in the Korean Intellectual Properly Office, the contents of which are herein incorporated by reference in their entirety.

BACKGROUND

1. Technical Field

Embodiments of the present disclosure are directed to a semiconductor package.

2. Discussion of the Related Art

Recently, as a need for implementing high-performance devices arises, the sizes of semiconductor chips has increased, and thus the sizes of semiconductor packages has also increased. On the other hand, the thicknesses of the semiconductor packages have rather decreased as electronic devices become slimmer.

On the other hand, semiconductor packages are being developed to satisfy many purposes, such as needs for multi-functionality, high capacity, and miniaturization. To this end several semiconductor chips are being integrated into one semiconductor package, thereby achieving high-capacity and multifunctional semiconductor packages while greatly reducing the size of the semiconductor packages.

SUMMARY

Embodiments of the present disclosure provide a semiconductor package that can effectively form a mold layer between a lower semiconductor package and an upper semiconductor package in a fabrication process by forming a plurality of recesses in edges of a substrate of the upper semiconductor package.

According to an exemplary embodiment of the present disclosure, there is provided a semiconductor package that includes a first substrate, a first semiconductor chip disposed on the first substrate, a second substrate disposed on the first semiconductor chip, a second semiconductor chip disposed on the second substrate, and a mold layer disposed between the first substrate and the second substrate. The second substrate comprises a recess formed at an edge, the mold layer fills the recess, and the recess protrudes concavely inward from the edge of the second substrate toward a center of the second substrate.

According to an exemplary embodiment of the present disclosure, there is provided a semiconductor package that includes a first semiconductor package that includes a first substrate and a first semiconductor chip electrically connected to the first substrate, a second semiconductor package disposed on the first semiconductor package and that includes a second substrate having a recess formed at an edge and a second semiconductor chip electrically connected to the second substrate, and a mold layer disposed between the first semiconductor package and the second semiconductor package. The mold layer fills the recess, and a level of an uppermost surface of the mold layer in the recess is higher than a level of a bottom surface of the second substrate.

According to an exemplary embodiment of the present disclosure, there is provided a semiconductor package that includes a first substrate, a first semiconductor chip disposed on the first substrate and that is electrically connected to the first substrate, a second substrate disposed on the first semiconductor chip, a second semiconductor chip disposed on the second substrate and that is electrically connected to the second substrate, a solder ball disposed between the first substrate and the second substrate and that electrically connects the first substrate to the second substrate, and a mold layer disposed between the first substrate and the second substrate. The second substrate includes a first recess formed on a first corner thereof and a second recess formed on a second corner opposite to the first corner, the mold layer surrounds the first semiconductor chip and the solder ball and fills each of the first and second recesses, wherein each of the first and second recesses protrudes concavely inward from its respective corner of the second substrate toward a center of the second substrate, and a level of an uppermost surface of the mold layer in each of the first and second recesses is higher than a level of a bottom surface of the second substrate.

According to an exemplary embodiment of the present disclosure, there is provided a method of fabricating a semiconductor package that includes the steps of forming a plurality of first semiconductor chips on a first substrate block and that are electrically connected to the first substrate block through a plurality of second solder balls, forming a first underfill material that surrounds side surfaces of the second solder balls; attaching fourth solder balls to an upper surface of the first substrate block and in between each the first semiconductor chips; attaching a second substrate block on the fourth solder balls, where the second substrate block is electrically connected to the first substrate block through the fourth solder balls; and forming a mold layer that completely fills a space between the first substrate block and the second substrate block.

BRIEF DESCRIPTION OF THE DRAWINGS

FIG. 19 is a cross-sectional view taken along line F-F' of FIG. 18.

FIGS. 21 and 22 are cross-sectional views taken along line F-F' of FIG. 20.

DETAILED DESCRIPTION OF EXEMPLARY EMBODIMENTS

Hereinafter, a semiconductor package according to embodiments of the present disclosure will be described with reference to FIGS. 1 to 3.

Figure 1:
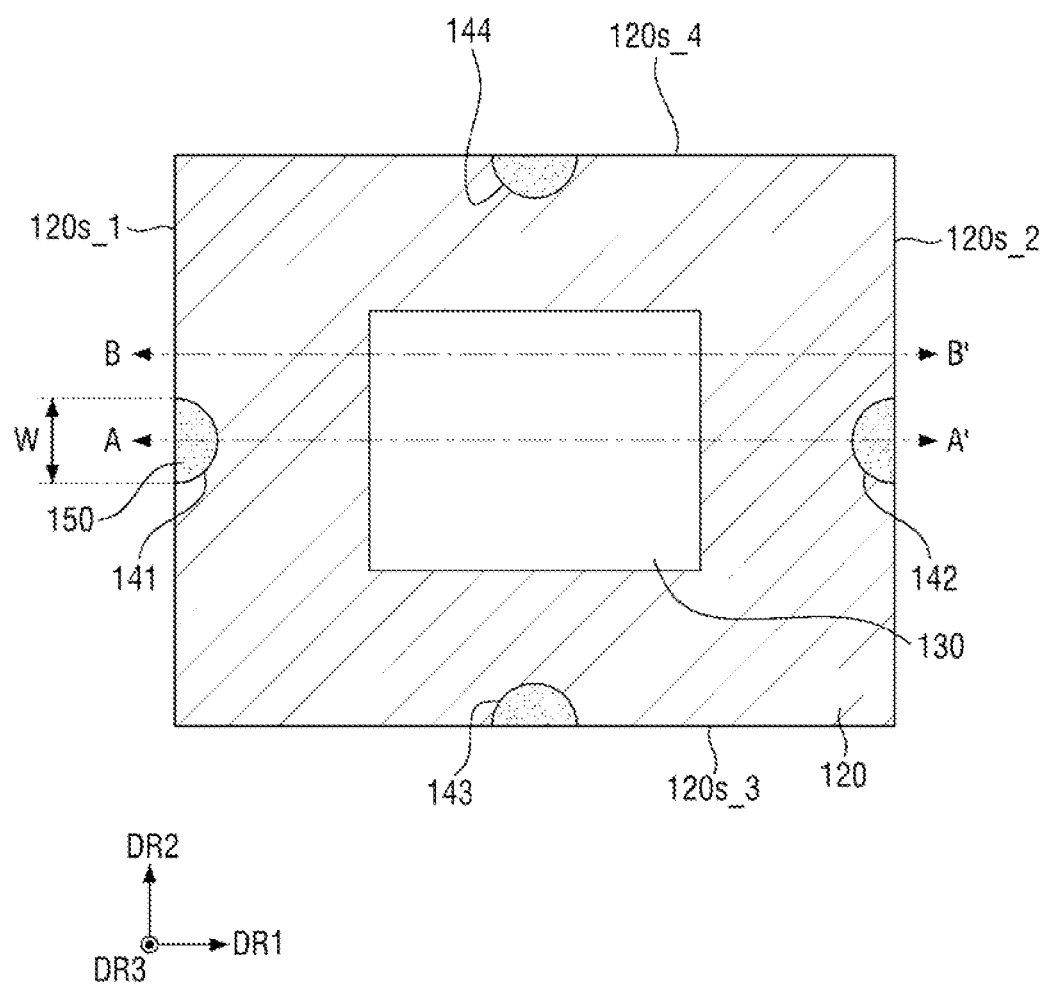
FIG. 1 is a plan view of a semiconductor package according to some embodiments of the present disclosure.

FIG. 1 is a plan view of a semiconductor package according to embodiments of the present disclosure. FIG. 2 is a cross-sectional view taken along line A-A' of FIG. 1. FIG. 3 is a cross-sectional view taken along line B-B' of FIG. 1.

Figure 2:
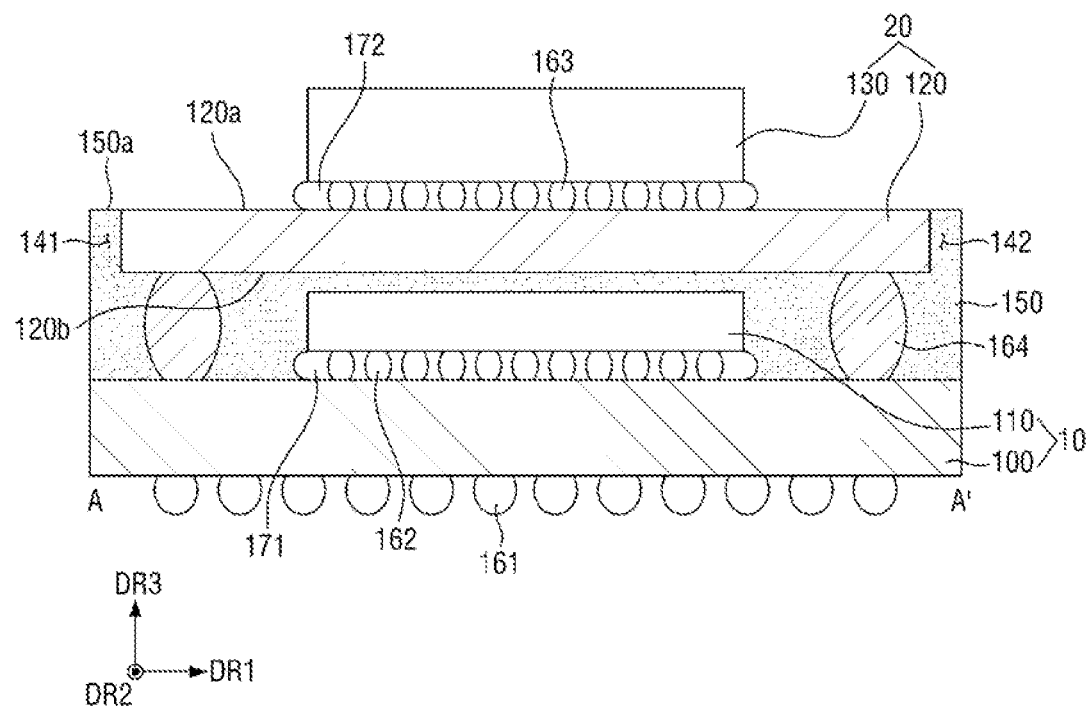
FIG. 2 is a cross-sectional view taken along line A-A' of FIG. 1.
Figure 3:
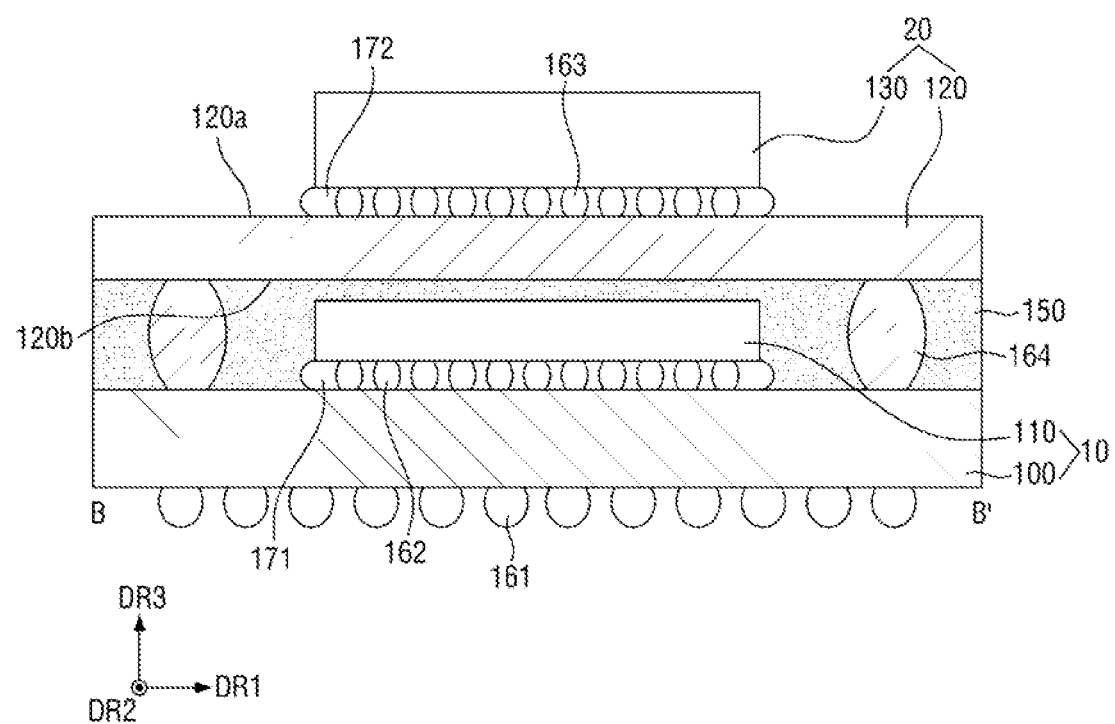
FIG. 3 is a cross-sectional view taken along line B-B' of FIG. 1.

Referring to FIGS. 1 to 3, a semiconductor package according to embodiments of the present disclosure includes a first semiconductor package 10, a second semiconductor package 20, first to fourth solder balls 161, 162, 163, and 164, first and second underfill materials 171 and 172 and a mold layer 150.

In an embodiment, the first semiconductor package 10 comprises a first substrate 100 and a first semiconductor chip 110.

The first substrate 100 may be, for example, a printed circuit board (PCB) or a ceramic substrate. However, embodiments of the present disclosure are not necessarily limited thereto.

When the first substrate 100 is a printed circuit board, the first, substrate 100 is formed of at least one of a phenol resin, an epoxy resin or a polyimide. For example, the first substrate 100 may include at least one of Flame Retardant 4 (FR4), tetrafunctional epoxy, polyphenylene ether, epoxy/polyphenylene oxide, bismaleimide triazine (BT), Thermount, cyanate ester, polyimide or a liquid crystal polymer. The surface of the first substrate 100 may be covered by a solder resist, but embodiments of the present disclosure are not necessarily limited thereto.

In an embodiment, the first solder balls 161 are disposed on the bottom surface of the first substrate 100. The first solder balls 161 are in contact with a conductive terminal disposed on the bottom surface of the first substrate 100. The first solder balls 161 protrude convexly from the bottom surface of the first substrate 100. The first solder balls 161 provide an electrical connection from the first substrate 100 to another external device.

The first solder ball 161 may include at least one of, for example, tin (Sn), indium (In), lead (Pb), zinc (Zn), nickel (Ni), gold (Au), silver (Au), copper (Cu), antimony (Sb), bismuth (Bi), or a combination thereof, but embodiments of the present disclosure are not necessarily limited thereto.

In an embodiment, the first semiconductor chip 110 is disposed on the upper surface of the first substrate 100. The first semiconductor chip 110 includes, for example, one semiconductor chip, but embodiments of the present disclosure are not necessarily limited thereto. In other embodiments, the first semiconductor chip 110 may be a semiconductor package that includes a plurality of semiconductor chips.

In an embodiment, the second solder balls 162 are disposed on the bottom surface of the first semiconductor chip 110. The second solder balls 162 are in contact with a conductive terminal disposed on the bottom surface of the first semiconductor chip 110. The second solder balls 162 protrude convexly from the bottom surface of the first semiconductor chip 110. The second solder balls 162 are in contact with a conductive terminal disposed on the upper surface of the first substrate 100. In other words, the second solder balls 162 are disposed between the first semiconductor chip 110 and the first substrate 100. The first semiconductor chip 110 is electrically connected to the first substrate 100 through the second solder balls 162.

The second solder balls 162 may include at least one of, for example, tin (Sn) indium (In), lead (Pb), zinc (Zn), nickel (Ni), gold (Au), silver (Ag), copper (Cu), antimony (Sb), bismuth (Bi), or a combination thereof, but embodiments of the present disclosure are not necessarily limited thereto.

In an embodiment, the first underfill material 171 surrounds the side surfaces of the second solder balls 162 between the upper surface of the first substrate 100 and the bottom surface of the first semiconductor chip 110. The first underfill material 171 protrudes laterally from the side surfaces of the first semiconductor chip 110, but embodiments of the present disclosure are not necessarily limited thereto.

In an embodiment, the second semiconductor package 20 is disposed on the first semiconductor package 10. The second semiconductor package 20 includes a second substrate 120 and a second semiconductor chip 130.

The second substrate 120 may be, for example a printed circuit board (PCB) or a ceramic substrate. However, embodiments of the present disclosure are not necessarily limited thereto. In other embodiments, the second substrate 120 is an interposer that contains silicon.

In an embodiment, the second substrate 120 is disposed on the first semiconductor chip 110. FIG. 2 illustrates that a bottom surface 120b of the second substrate 120 is spaced apart from the first semiconductor chip 110, but embodiments of the present disclosure are not necessarily limited thereto. In other embodiments, the bottom surface 120b of the second substrate 120 is in contact with the first semiconductor chip 110.

FIG. 2 illustrates that the mold layer 150 is disposed between the bottom surface 120b of the second substrate 120 and the first semiconductor chip 110, but embodiments of the present disclosure are not necessarily limited thereto. In other embodiments, an adhesive layer or a heat transfer layer can be disposed between the bottom surface 120b of the second substrate 120 and the first semiconductor chip 110.

In an embodiment, the second substrate 120 includes first to fourth recesses 141, 142, 143, and 144 formed, for example, in edges thereof. Although FIG. 1 illustrates that four recesses are formed in the second substrate 120, the number of the recesses formed in the second substrate 120 is not necessarily limited thereof.

In an embodiment, the first recess 141 is formed on a first side surface 120s_1 of the second substrate 120. The first recess 141 protrudes concavely inward from the first side surface 120s_1 of the second substrate 120 toward the center of the second substrate 120.

In an embodiment, the second recess 142 is formed on a second side surface 120s_2 of the second substrate 120 opposite to the first side surface 120s_1 of the second substrate 120. The second recess 142 is spaced apart from the first recess 141 in a first direction DR1. The second recess 142 protrudes concavely inward from the second side surface 120s_2 of the second substrate 120 toward the center of the second substrate 120.

In an embodiment, the third recess 143 is formed on a third side surface 120s_3 of the second substrate 120. The third recess 143 protrudes concavely inward from the third side surface 120s_3 of the second substrate 120 toward the center of the second substrate 120.

In an embodiment, the fourth recess 144 is formed on a fourth side surface 120s_4 of the second substrate 120 opposite to the third side surface 120s_3 of the second substrate 120. The fourth recess 144 is spaced apart from the third recess 143 in a second direction DR2 that differs from the first direction DR1. The fourth recess 144 protrudes concavely inward from the fourth side surface 120s_4 of the second substrate 120 toward the center of the second substrate 120.

In an embodiment, each of the first to fourth recesses 141 to 144 has, for example, a semicircular shape. However, embodiments of the present disclosure are not necessarily limited thereto, and the recesses have other shapes in other embodiments.

In an embodiment, a width W of the first recess 141 in the second direction DR2 along the edge of the second substrate ranges from 50 µm to 500 µm. The width of the second recess 142 in the second direction DR2 along the edge of the second substrate ranges from 50 µm to 500 µm. The width of each of the third and fourth recesses 143 and 144 in the first direction DR1 along the edge of the second substrate range from 50 µm to 500 µm.

In an embodiment, the second semiconductor chip 130 is disposed on an upper surface 120a of the second substrate 120. The second semiconductor chip 130 includes, for example, one semiconductor chip, but embodiments of the present disclosure are not necessarily limited thereto. In other embodiments, the second semiconductor chip 130 is a semiconductor package that includes a plurality of semiconductor chips.

In an embodiment, the third solder balls 163 are disposed on the bottom surface of the second semiconductor chip 130. The third solder balls 163 are in contact with a conductive terminal disposed on the bottom surface of the second semiconductor chip 130. The third solder balls 163 protrude convexly from the bottom surface of the second semiconductor chip 130. The third solder balls 163 are in contact with a conductive terminal disposed on the upper surface 120a of the second substrate 120. The second semiconductor chip 130 is electrically connected to the second substrate 120 through the third solder balls 163.

The third solder balls 163 may include at least one of, for example, tin (Sn), indium (In), lead (Pb), zinc (Zn), nickel (Ni), gold (Au), silver (Ag), copper (Cu), antimony (Sb), bismuth (Bi), or a combination thereof, but embodiments of the present disclosure are not necessarily limited thereto.

In an embodiment, the second underfill material 172 surrounds the side surfaces of the third solder balls 163 between the upper surface 120a of the second substrate 120 and the bottom surface of the second semiconductor chip 130. The second underfill material 172 protrudes laterally from the side surfaces of the second semiconductor chip 130, but embodiments of the present disclosure are not necessarily limited thereto.

In an embodiment, the mold layer 150 is disposed between the upper surface of the first substrate 100 and the bottom surface 120b of the second substrate 120. In addition, the mold layer 150 fills each of the first to fourth recesses 141 to 144. The mold layer 150 surrounds the side surfaces of the first underfill material 171, and the side and upper surfaces of the first semiconductor chip 110.

In an embodiment, an uppermost surface 150a of the mold layer 150 disposed in each of the first to fourth recesses 141 to 144 is higher than the bottom surface 120b of the second substrate 120.

For example, the uppermost surface 150a of the mold layer 150 in each of the first to fourth recesses 141 to 144 is coplanar with the upper surface 120a of the second substrate 120. However, embodiments of the present disclosure are not necessarily limited thereto. In other embodiments, a level of the uppermost surface 150a of the mold layer 150 in each of the first to fourth recesses 141 to 144 is located between the upper surface 120a and the bottom surface 120b of the second substrate 120.

The mold layer 150 may contain, for example, an epoxy molding compound (EMC) or two or more kinds of silicone hybrid materials.

In an embodiment, the fourth solder balls 164 are disposed between the upper surface of the first substrate 100 and the bottom surface 120b of the second substrate 120. The fourth solder balls 164 penetrate the mold layer 150 in a third direction DR3 perpendicular to the first and second directions DR1 and DR2.

In an embodiment, the fourth solder balls 164 are in contact with each of a conductive terminal disposed on the upper surface of the first substrate 100 and a conductive terminal disposed on the bottom surface 120b of the second substrate 120. The second substrate 120 is electrically connected to the first substrate 100 through the fourth solder balls 164.

The fourth solder balls 164 may include at least one of, for example, tin (Sn), indium (In), lead (Pb), zinc (Zn), nickel (Ni), gold (Au), silver (Ag), copper (Cu), antimony (Sb), bismuth (Bi), or a combination thereof, but embodiments of the present disclosure are not necessarily limited thereto.

A semiconductor package according to embodiments of the present disclosure includes recesses 141 to 144 formed in the edges of the substrate 120 of the upper semiconductor package 20, so that the mold layer 150 can be effectively formed between the lower semiconductor package 10 and the upper semiconductor package 20 in a fabrication process.

Hereinafter, a semiconductor package according to other embodiments of the present disclosure will be described with reference to FIG. 4. A description will be given focusing on differences from a semiconductor package illustrated in FIGS. 1 to 3.

Figure 4:
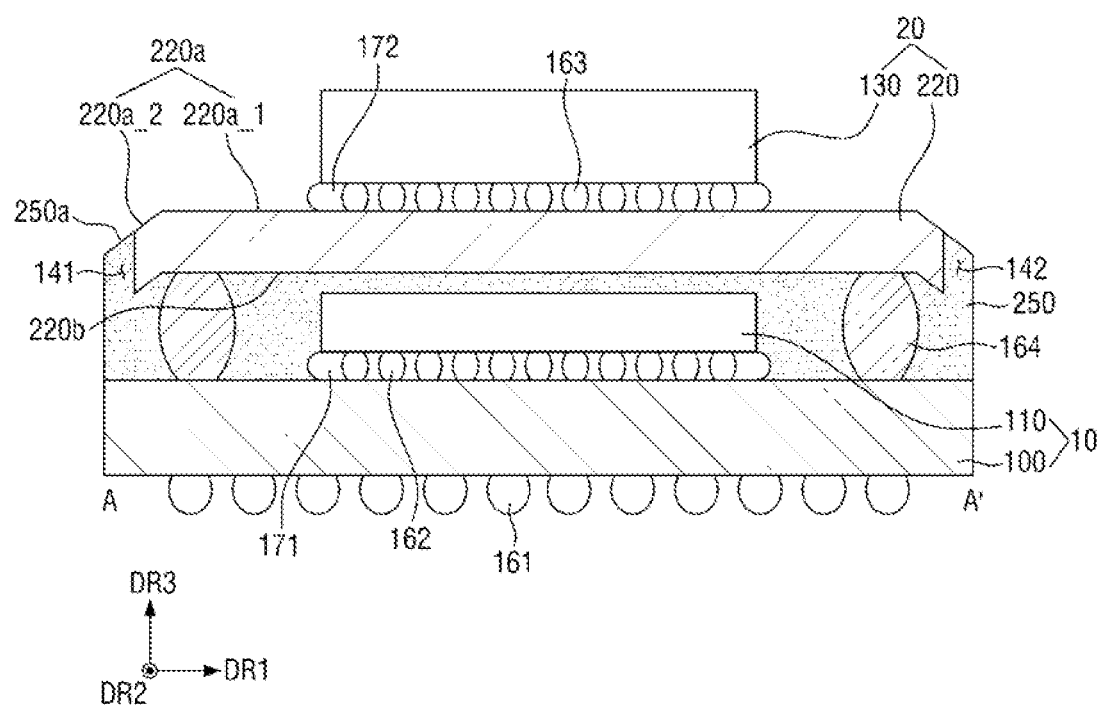
FIG. 4 is a cross-sectional view of a semiconductor package according to embodiments of the present disclosure.

FIG. 4 is a cross-sectional view of a semiconductor package according to some embodiments of the present disclosure.

Referring to FIG. 4, edges of a second substrate 220 have inclined profiles in the semiconductor package according to some embodiments of the present disclosure.

In an embodiment, an upper surface 220a of the second substrate 220 include a first upper surface 220a_1 and a second upper surface 220a_2 connected to the edge of the first upper surface 220*a*_1. The first upper surface 220*a*_1 of the second substrate 220 has a planar shape and is parallel to a lower surface of the second semiconductor chip 130. The second tipper surface 220*a*_2 of the second substrate 220 is inclined with respect to the first upper surface 220*a*_1, and is not parallel to a lower surface of the second semiconductor chip 130. That is, the upper surface 220*a* of the second substrate 220 has an inclined profile due to the second upper surface 220*a*_2 of the second substrate 220.

In an embodiment, the bottom surface 220*b* of the second substrate 220 also has an inclined profile similar to that of the upper surface 220*a* of the second substrate 220.

In an embodiment, an uppermost surface 250*a* of a mold layer 250 in each of the first to fourth recesses 141 to 144 is inclined and coplanar with the second upper surface 220*a*_2 of the second substrate 220.

Hereinafter, a semiconductor package according to embodiments of the present disclosure will be described with reference to FIGS. 5 and 6. A description will be given focusing on differences from a semiconductor package illustrated in FIGS. 1 to 3.

Figure 5:
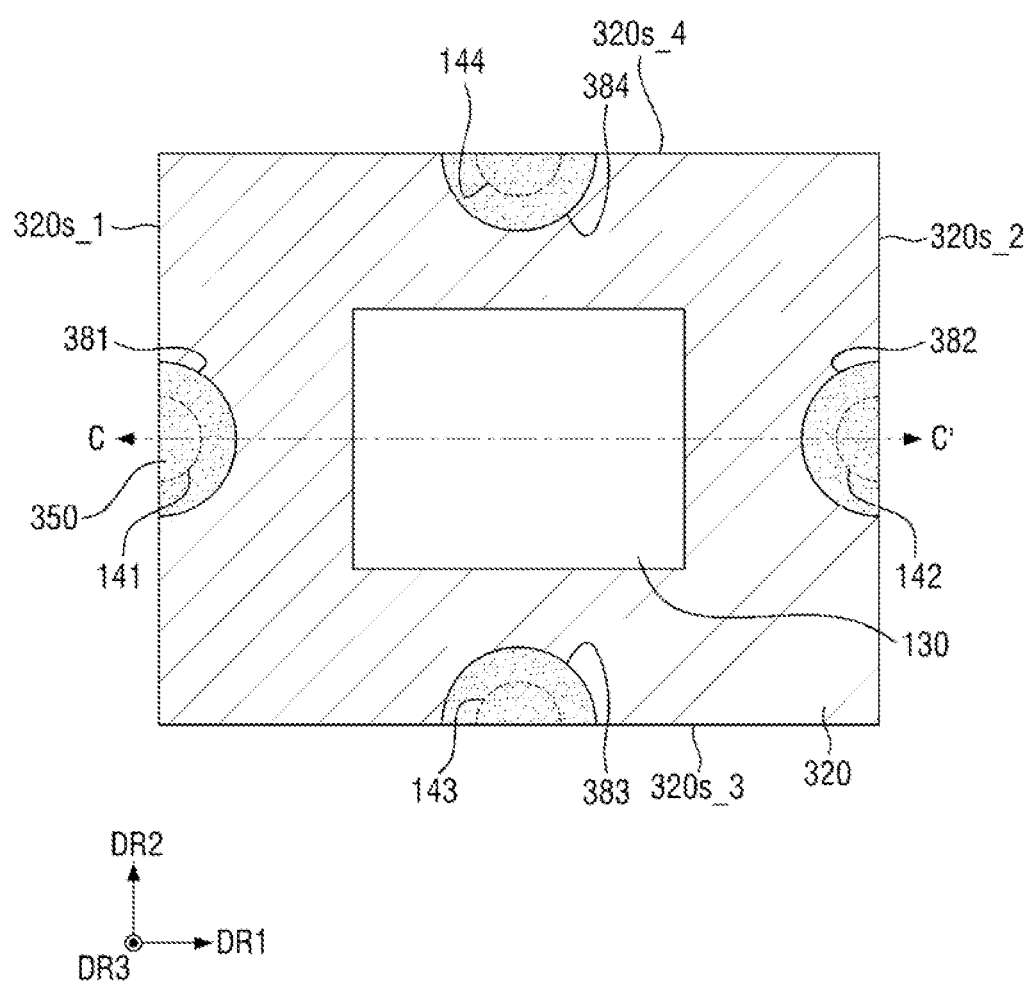
FIG. 5 is a plan view of a semiconductor package according to embodiments of the present disclosure.

FIG. 5 is a plan view of a semiconductor package according to embodiments of the present disclosure. FIG. 6 is a cross-sectional view taken along line C-C' of FIG. 5.

Figure 6:
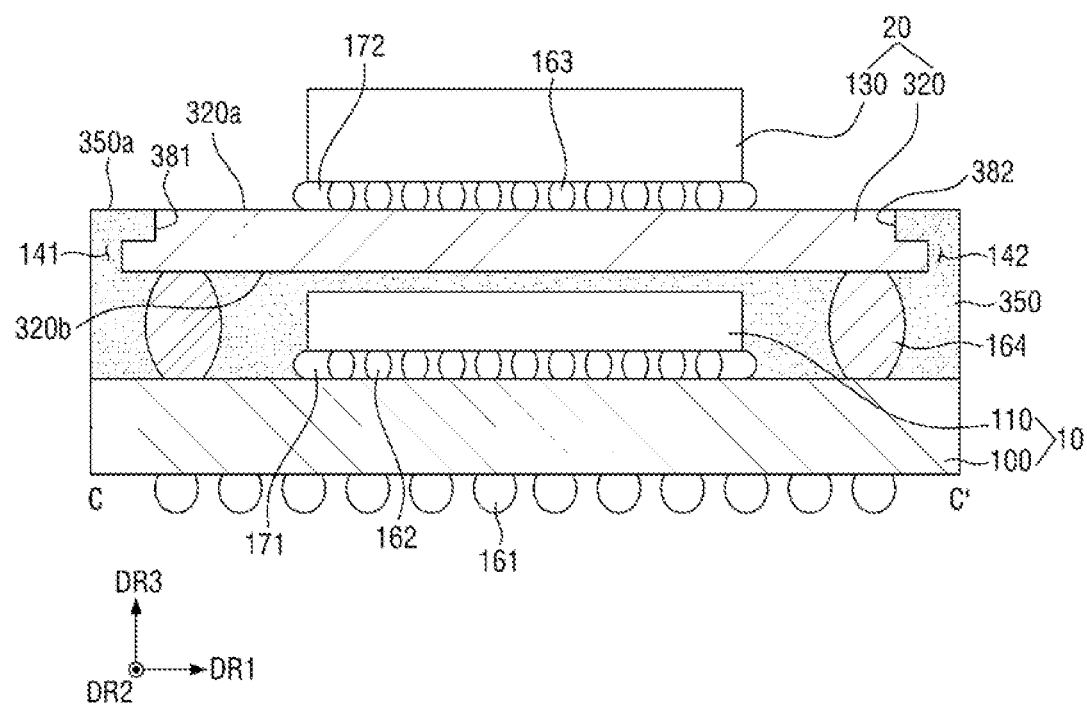
FIG. 6 is a cross-sectional view taken along line C-C' of FIG. 5.

Referring to FIGS. 5 and 6, a semiconductor package according to embodiments of the present disclosure includes a plurality of trenches 381, 382, 383, and 384 formed in edges of a second substrate 320.

In an embodiment, the first trench 381 is formed on a first side surface 320*s*_1 of the second substrate 320. The first trench 381 protrudes concavely inward from the first side surface 320*s*_1 of the second substrate 320 toward the center of the second substrate 320. The first trench 381 surrounds the first recess 141. A level of the bottom surface of the first trench 381 is higher than a level of the bottom surface of the first recess 141. The bottom surface of the first trench 381 is formed between an upper surface 320*a* and a bottom surface 320*b* of the second substrate 320.

In an embodiment, the second trench 382 is formed on a second side surface 320*s*_2 of the second substrate 320. The third trench 383 is formed on a third side surface 320*s*_3 of the second substrate 320. The fourth trench 384 is formed on a fourth side surface 320*s*_4 of the second substrate 320. Each of the second to fourth trenches 382, 383, and 384 has a structure similar to that of the first trench 381.

In an embodiment, a mold layer 350 is disposed in each of the first to fourth trenches 381, to 384. For example, the mold layer 350 completely fills each of the first to fourth trenches 381 to 384.

In an embodiment, an uppermost surface 350*a* of the mold layer 350 in each of the first to fourth trenches 381 to 384 is coplanar with the upper surface 320*a* of the second substrate 320.

Hereinafter, a semiconductor package according to embodiments of the present disclosure will be described with reference to FIGS. 7 and 8. A description will be given focusing on differences from a semiconductor package illustrated in FIGS. 1 to 3.

Figure 7:
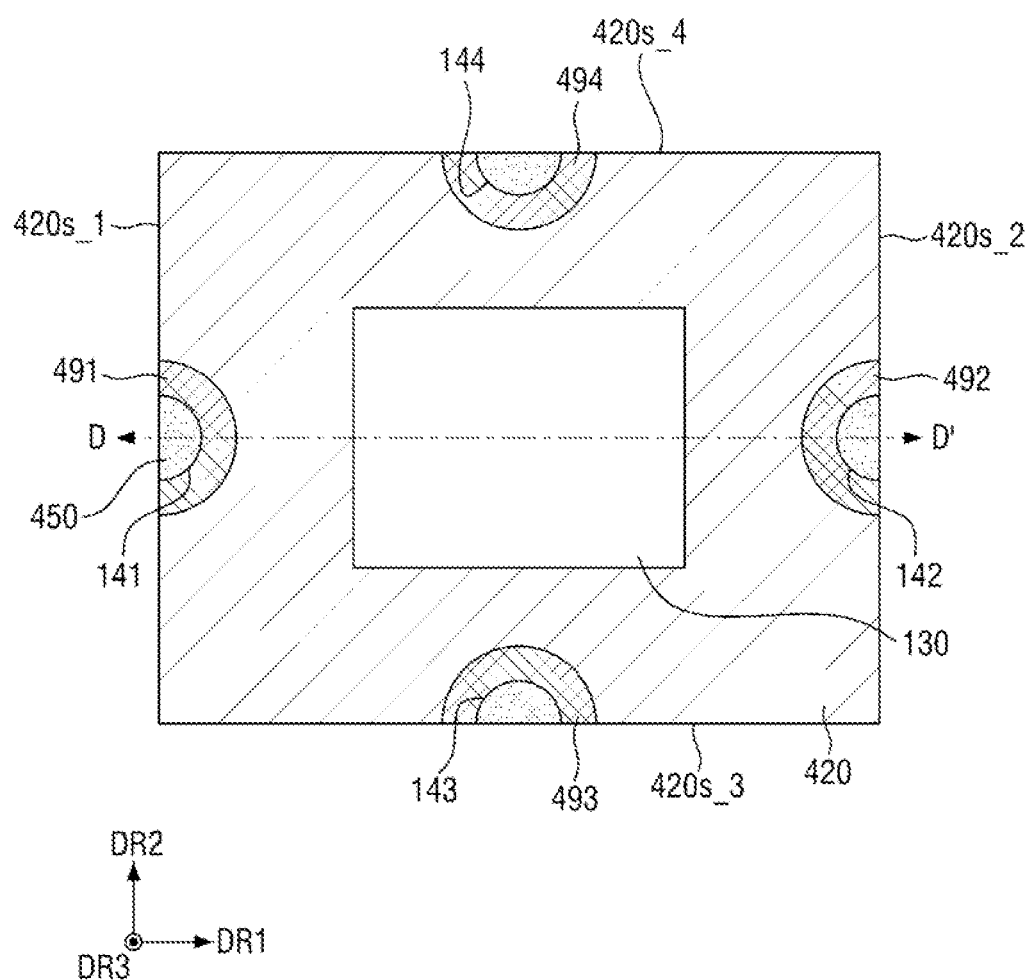
FIG. 7 is a plan view of a semiconductor package according to embodiments of the present disclosure.

FIG. 7 is a plan view of a semiconductor package according to embodiments of the present disclosure. FIG. 8 is a cross-sectional view taken along line D-D' of FIG. 7.

Figure 8:
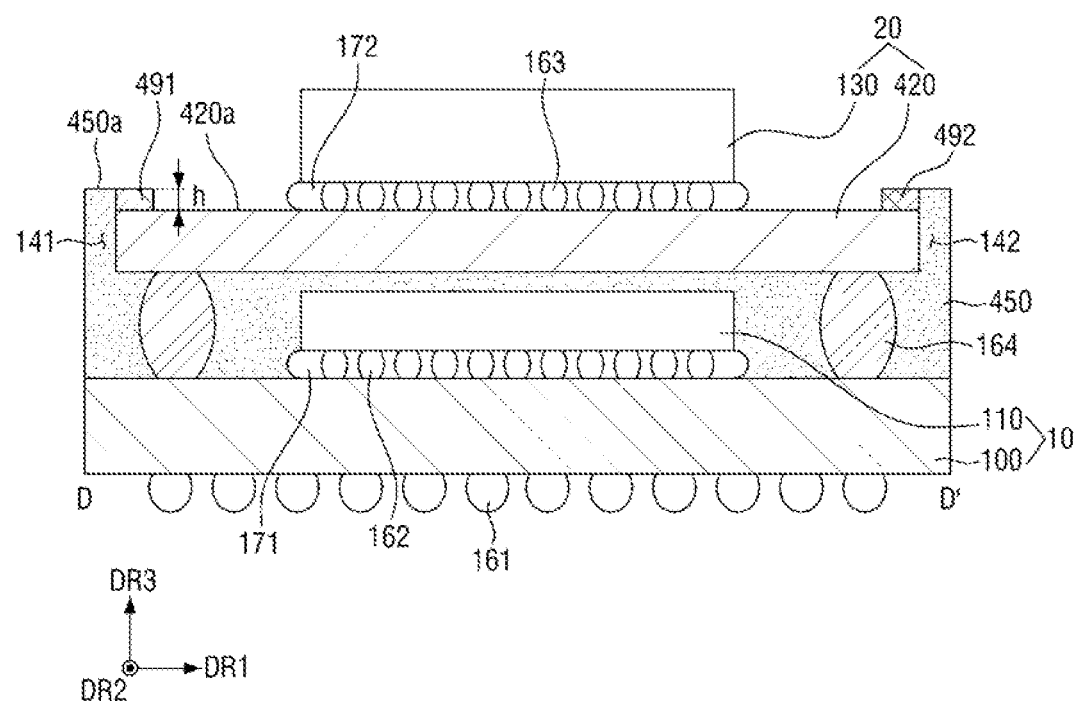
FIG. 8 is a cross-sectional view taken along line D-D' of FIG. 7.

Referring to FIGS. 7 and 8, a semiconductor package according to embodiments of the present disclosure includes a plurality of dams 491, 492, 493 and 494 formed at edges of a second substrate 420.

In an embodiment, the first dam 491 is formed on an upper surface 420*a* near a first side surface 420*s*_1 of the second substrate 420. The first dam 491 protrudes upward from the upper surface 420*a* of the second substrate 420 in the third direction DR3.

In an embodiment, the first dam 491 surrounds the first recess 141. That is, the first dam 491 surrounds the first recess 141 so that the first recess 141 can extend upward from the upper surface 420*a* of the second substrate 420 in the third direction DR3. A side surface of the first dam 491 is in contact with a mold layer 450. An uppermost surface 450*a* of the mold layer 450 in the first recess 141 is coplanar with the upper surface of the first dam 491. A height h of the first dam 491 in the third direction DR3 above the upper surface of the second substrate ranges from 10 μm to 50 μm.

In an embodiment, the second dam 492 is formed on the upper surface 420*a* near a second side surface 420*s*_2 of the second substrate 420. The third dam 493 is formed on the upper surface 420*a* near a third side surface 420*s*_3 of the second substrate 420. The fourth dam 494 is formed on the upper surface 420*a* near a fourth side surface 420*s*_4 of the second substrate 420. Each of the second to fourth dams 492, 493 and 494 has a structure similar to that of the first dam 491.

Hereinafter, a semiconductor package according to embodiments of the present disclosure will be described with reference to FIGS. 9 and 10. A description will be given focusing on differences from a semiconductor package illustrated in FIGS. 1 to 3.

Figure 9:
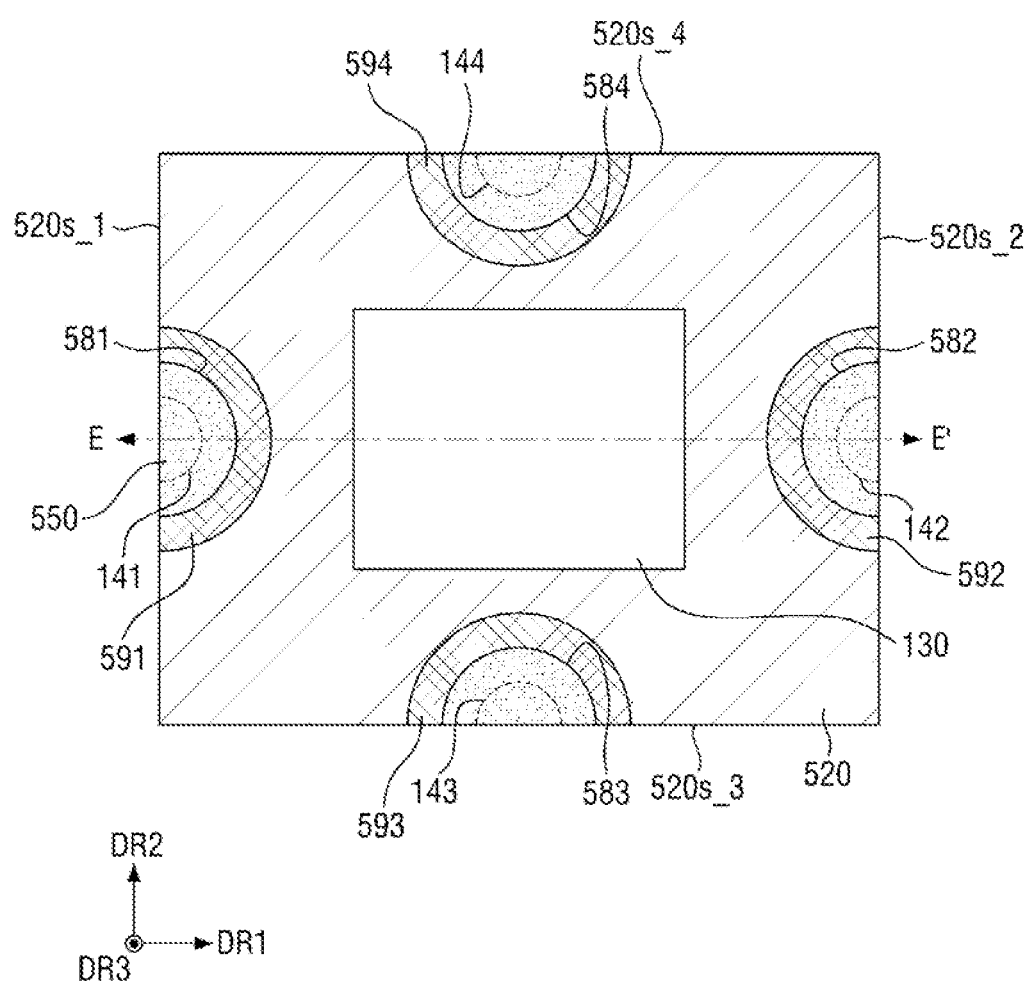
FIG. 9 is a plan view of a semiconductor package according to embodiments of the present disclosure.

FIG. 9 is a plan view of a semiconductor package according to embodiments of the present disclosure. FIG. 10 is a cross-sectional view taken along line E-E' of FIG. 9.

Figure 10:
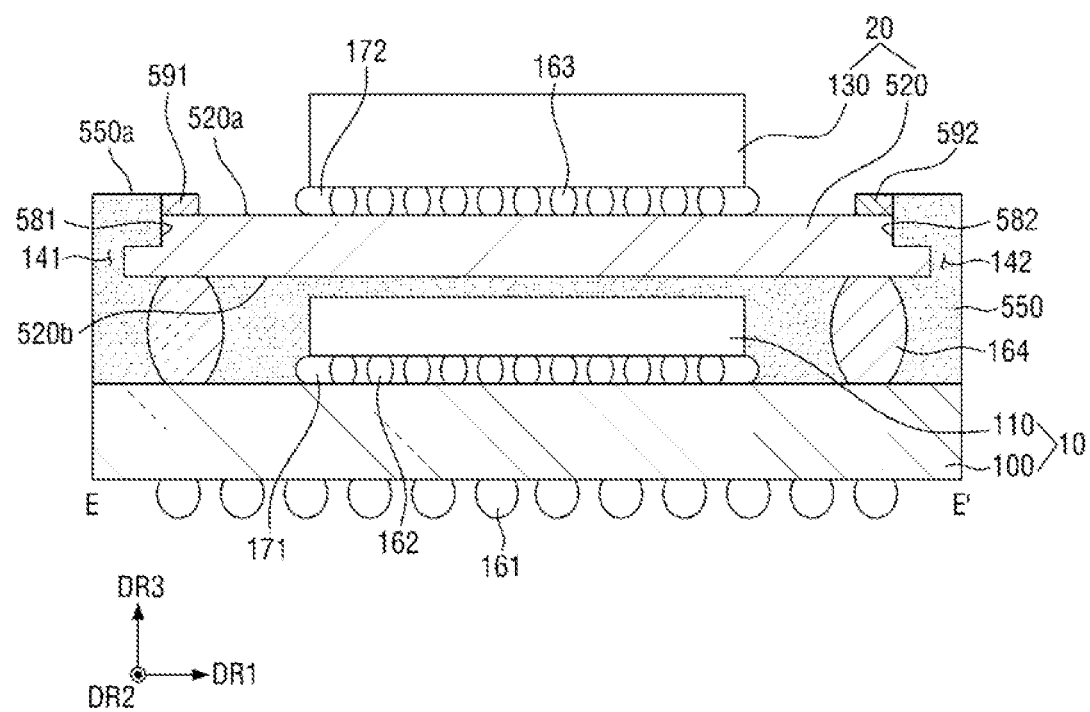
FIG. 10 is a cross-sectional view taken along line E-E' of FIG. 9.

Referring to FIGS. 9 and 10, a semiconductor package according to embodiments of the present disclosure includes a plurality of trenches 581, 582, 583 and 584 and a plurality of dams 591, 592, 593 and 594 formed at edges of a second substrate 520.

In an embodiment, the first trench 581 is formed on a first side surface 520*s*_1 of the second substrate 520. The first trench 581 protrudes concavely inward from the first side surface 520*s*_1 of the second substrate 520 toward the center of the second substrate 520. The first trench 581 surrounds the first recess 141. A level of the bottom surface of the first trench 581 is higher than a level of the bottom surface of the first recess 141. The bottom surface of the first trench 581 is located between an upper surface 520*a* and a bottom surface 520*b* of the second substrate 520.

In an embodiment, the second trench 582 is formed on a second side surface 520*s*_2 of the second substrate 520. The third trench 583 is formed on a third side surface 520*s*_3 of the second substrate 520. The fourth trench 584 is formed on a fourth side surface 520*s*_4 of the second substrate 520. Each of the second to fourth trenches 582, 583, and 584 has a structure similar to that of the first trench 581.

In an embodiment, a mold layer 550 is disposed in each of the first to fourth trenches 581 to 584. For example, the mold layer 550 completely fills each of the first to fourth trenches 581 to 584.

In an embodiment, the first dam 591 is formed on the upper surface 520*a* near the first side surface 520*s*_1 of the second substrate 520. The first dam 591 protrudes upward from the upper surface 520*a* of the second substrate 520 in the third direction DR3.

In an embodiment, the first dam 591 surrounds the first recess 141. That is, the first dam 591 surrounds the first trench 581 so that the first trench 581 can extend downward from the upper surface 520*a* of the second substrate 520 in the third direction DR3. The side surface of the first dam 591 is in contact with the mold layer 550. An uppermost surface 550a of the mold layer 550 in each of the first recess 141 and the first trench 581 is coplanar with the upper surface of the first dam 591. The height h, which corresponds to height h of FIG. 8, of the first dam 591 in the third direction DR3 above the upper surface of the second substrate ranges from 10 µm to 50 µm.

In an embodiment, the second dam 592 is formed on the upper surface 520a near the second side surface 520s_2 of the second substrate 520. The third dam 593 is formed on the upper surface 520a near the third side surface 520s_3 of the second substrate 520. The fourth dam 594 is formed on the upper surface 520a near the fourth side surface 520s_4 of the second substrate 520. Each of the second to fourth dams 592, 593, and 594 has a structure similar to that of the first dam 591.

Hereinafter, a semiconductor package according to embodiments of the present disclosure will be described with reference to FIG. 11. A description will be given focusing on differences from a semiconductor package illustrated in FIGS. 1 to 3.

Figure 11:
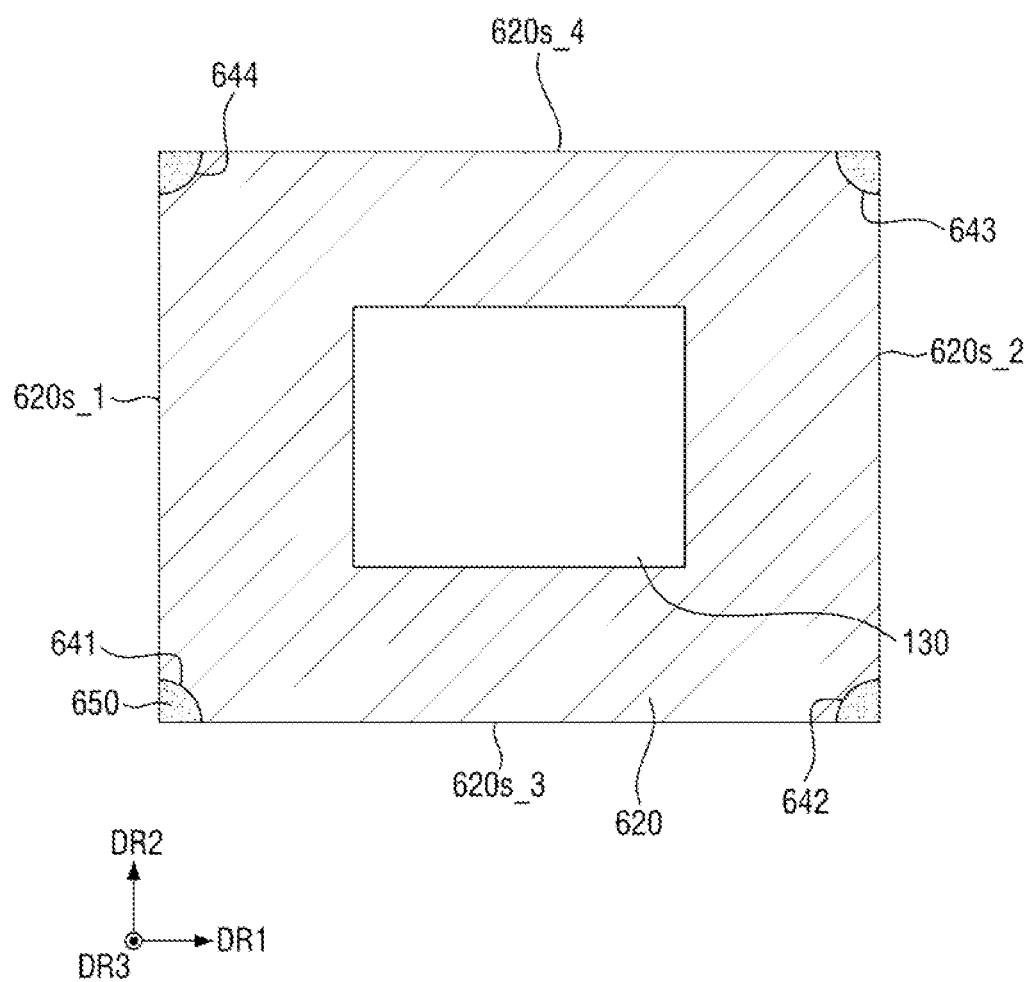
FIG. 11 is a plan view of a semiconductor package according to embodiments of the present disclosure.

FIG. 11 is a plan view of a semiconductor package according to embodiments of the present disclosure.

Referring to FIG. 11, in an embodiment, a semiconductor package according to embodiments of the present disclosure includes a plurality of recesses 641, 642, 643, and 644 formed at corners or vertices of a second substrate 620.

In an embodiment, the first recess 641 is formed at a corner or portion where a first side surface 620s_1 of the second substrate 620 meets a third side surface 620s_3 of the second substrate 620. The second recess 642 is formed at a corner or portion where the third side surface 620s_3 of the second substrate 620 meets a second side surface 620s_2 of the second substrate 620. The third recess 643 is formed at a corner or portion where the second side surface 620s_2 of the second substrate 620 meets a fourth side surface 620s_4 of the second substrate 620. The fourth recess 644 is formed at a corner or portion where the fourth side surface 620s_4 of the second substrate 620 meets the first side surface 620s_1 of the second substrate 620. Although FIG. 11 shows that each of the first, second, third and fourth recesses 641, 642, 643 and 644 has a curved shape that protrudes concavely inward from their respective corners toward the center of the second substrate 620, embodiments of the disclosure are not necessarily limited thereto, and the first, second, third and fourth recesses 641, 642, 643 and 644 may have other shapes.

In an embodiment, a mold layer 650 is disposed in each of the first to fourth recesses 641 to 644.

Hereinafter, a semiconductor package according to embodiments of the present disclosure will be described with reference to FIG. 12. A description will be given focusing on differences from a semiconductor package illustrated in FIGS. 1 to 3.

Figure 12:
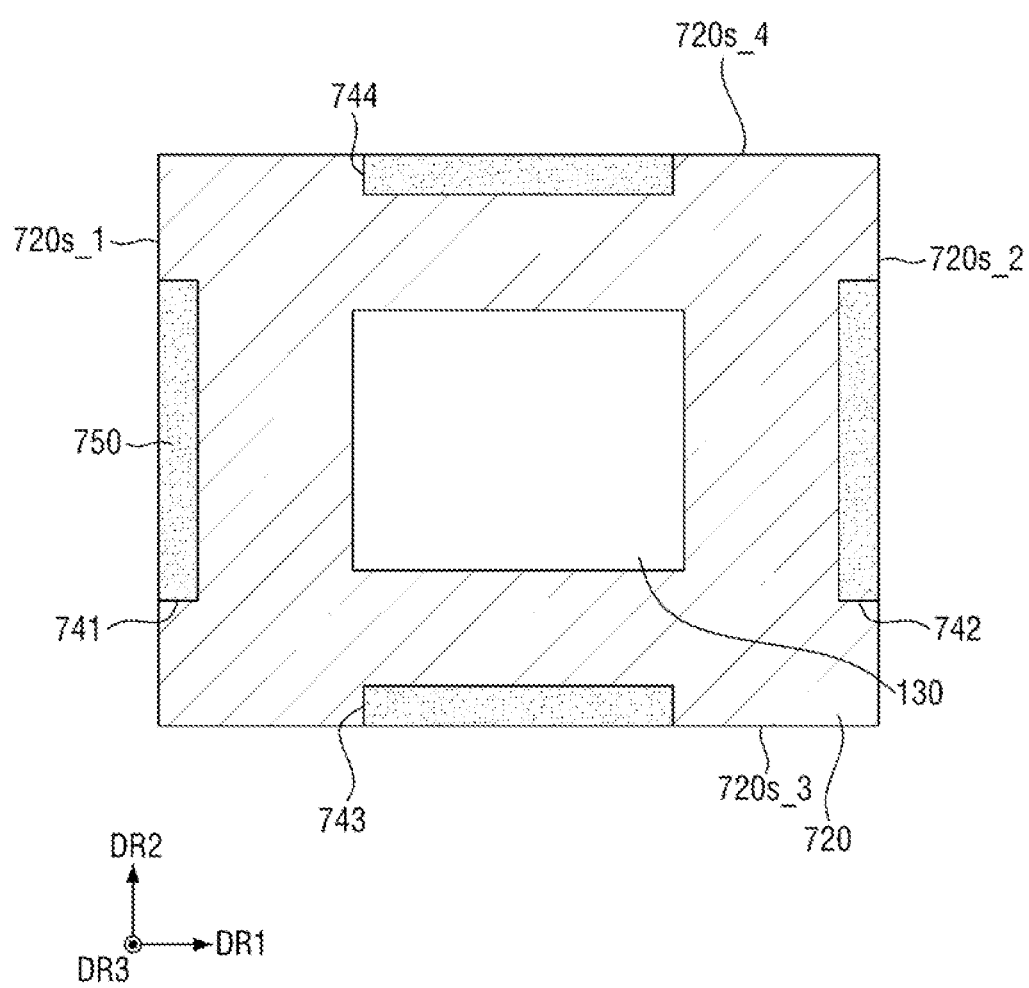
FIG. 12 is a plan view of a semiconductor package according to embodiments of the present disclosure.

FIG. 12 is a plan view of a semiconductor package according to embodiments of the present disclosure.

Referring to FIG. 12, in an embodiment, a semiconductor package according to embodiments of the present disclosure includes a plurality of recesses 741, 742, 743, and 744 formed in edges of a second substrate 720.

In an embodiment, the first recess 741 is formed on a first side surface 720s_1 of the second substrate 720. The second recess 742 is formed on a second side surface 720s_2 of the second substrate 720. The third recess 743 is formed on a third side surface 720s_3 of the second substrate 720. The fourth recess 744 may be formed en a fourth side surface 720s_4 of the second substrate 720.

In an embodiment, each of the first to fourth recesses 741 to 744 has a rectangular shape in a plan view. For example, the first recess 741 has a rectangular shape that extends in the second direction DR2 in a plan view.

In an embodiment, a mold layer 750 is disposed in each of the first to fourth recesses 741 to 744.

Hereinafter, a semiconductor package according to embodiments of the present disclosure will be described with reference to FIG. 13. A description will be given focusing on differences from a semiconductor package illustrated in FIGS. 1 to 3.

Figure 13:
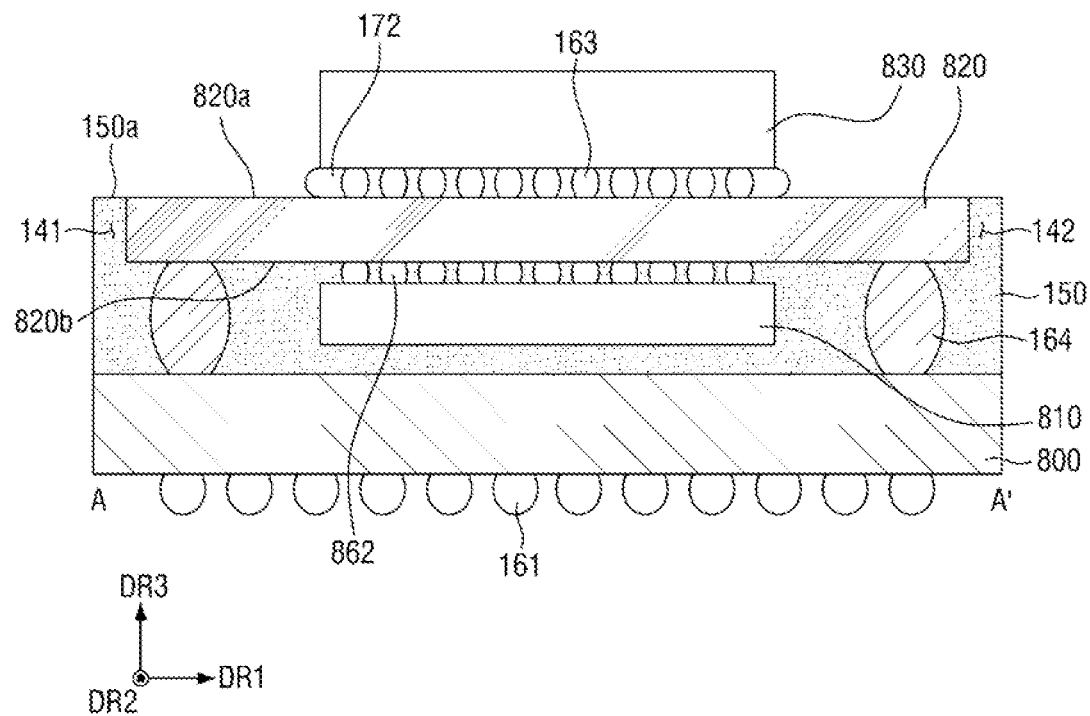
FIG. 13 is a cross-sectional view of a semiconductor package according to embodiments of the present disclosure.

FIG. 13 is a cross-sectional view of a semiconductor package according to embodiments of the present disclosure.

Referring to FIG. 13, in a semiconductor package according to embodiments of the present disclosure, a first semiconductor chip 810 is electrically connected to a second substrate 820.

In an embodiment, the first semiconductor chip 810 is electrically connected to the second substrate 820 through second solder balls 862 disposed on a bottom surface 820b of the second substrate 820. The first semiconductor chip 810 is spaced apart from a first substrate 800 in the third direction DR3.

In an embodiment, a second semiconductor chip 830 is disposed on an upper surface 820a of the second substrate 820. The second semiconductor chip 830 is electrically connected to the first semiconductor chip 810 through the second substrate 820.

Hereinafter, a semiconductor package according to embodiments of the present disclosure will be described with reference to FIG. 14. A description will be given focusing on differences from a semiconductor package illustrated in FIG. 4.

Figure 14:
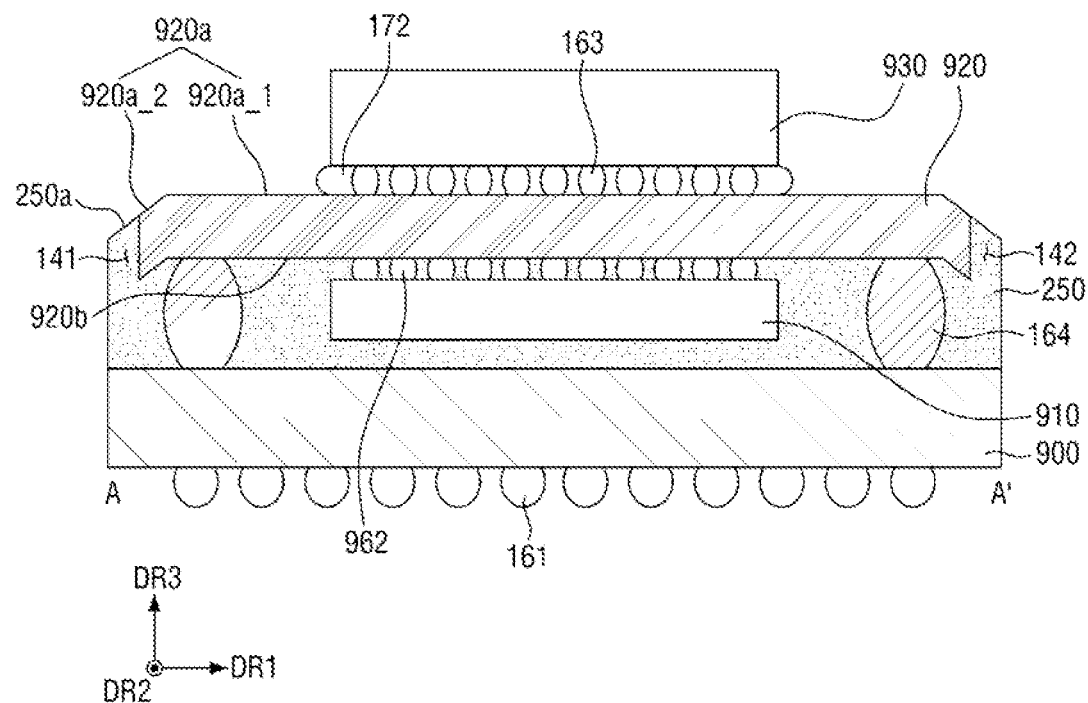
FIG. 14 is a cross-sectional view of a semiconductor package according to embodiments of the present disclosure.

FIG. 14 is a cross-sectional view of a semiconductor package according to embodiments of the present disclosure.

Referring to FIG. 14, in a semiconductor package according to embodiments of the present disclosure, a first semiconductor chip 910 is electrically connected to a second substrate 920.

In an embodiment, the first semiconductor chip 910 is electrically connected to the second substrate 920 through second solder balls 962 disposed on a bottom surface 920b of the second substrate 920. The first semiconductor chip 910 is spaced apart from a first substrate 900 in the third direction DR3.

In an embodiment, a second semiconductor chip 930 is disposed on an upper surface 920a of the second substrate 920. The second semiconductor chip 930 is electrically connected to the first semiconductor chip 910 through the second substrate 920.

In an embodiment, the upper surface 920a of the second substrate 920 includes a first upper surface 920a_1 and a second upper surface 920a_2 connected to an edge of the first upper surface 920a_1. The first upper surface 920a_1 of the second substrate 920 may have a planar shape and is parallel to a lower surface of the second semiconductor chip 130. The second upper surface 920a_2 of the second substrate 920 is inclined with respect to the first upper surface 220a_1, and is not parallel to a lower surface of the second semiconductor chip 130. That is, the upper surface 920a of the second substrate 920 has an inclined profile due to the second upper surface 920a_2 of the second substrate 920.

Hereinafter, a semiconductor package according to embodiments of the present disclosure will be described with reference to FIG. 15. A description will be given focusing on differences from a semiconductor package illustrated in FIG. 6.

Figure 15:
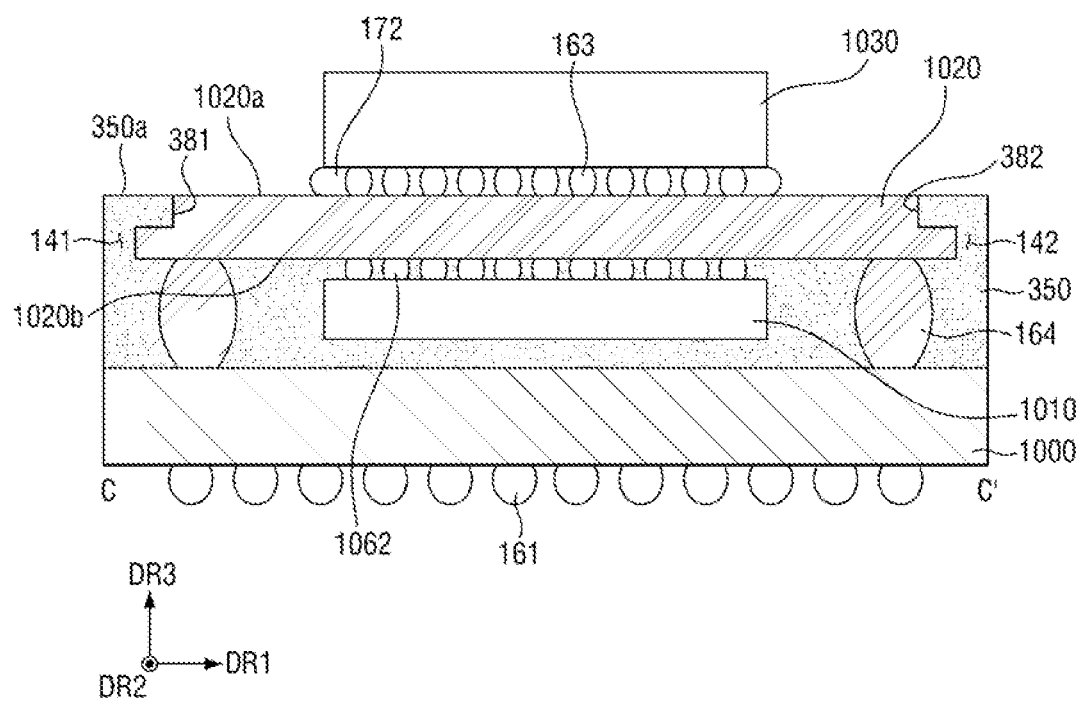
FIG. 15 is a cross-sectional view of a semiconductor package according to embodiments of the present disclosure.

FIG. 15 is a cross-sectional view of a semiconductor package according to embodiments of the present disclosure.

Referring to FIG. 15, in a semiconductor package according to embodiments of the present disclosure, a first semiconductor chip 1010 is electrically connected to a second substrate 1020.

In an embodiment, the first semiconductor chip 1010 is electrically connected to the second substrate 1020 through second solder balls 1062 disposed on a bottom surface 1020b of the second substrate 1020. The first semiconductor chip 1010 is spaced apart from a first substrate 1000 in the third direction DR3.

In an embodiment, a second semiconductor chip 1030 is disposed on an upper surface 1020a of the second substrate 1020. The second semiconductor chip 1030 is electrically connected to the first semiconductor chip 1010 through the second substrate 1020.

Hereinafter, a semiconductor package according to embodiments of the present disclosure will be described with reference to FIG. 16. A description will be given focusing on differences from a semiconductor package illustrated in FIG. 8.

Figure 16:
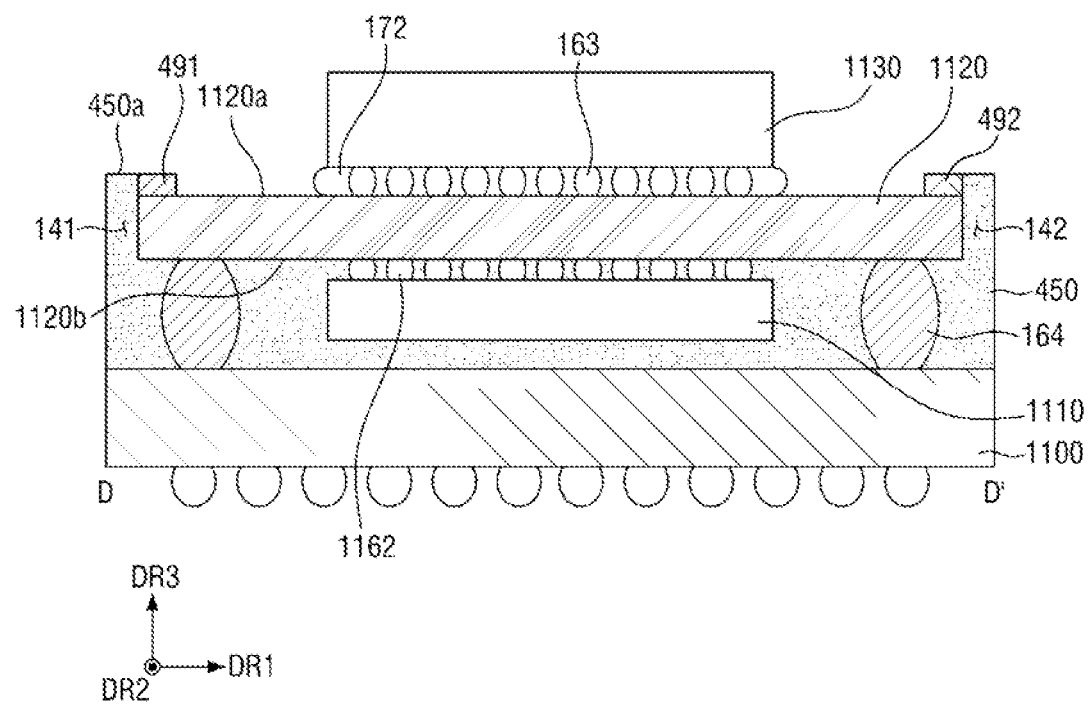
FIG. 16 is a cross-sectional view of a semiconductor package according to embodiments of the present disclosure.

FIG. 16 is a cross-sectional view of a semiconductor package according to embodiments of the present disclosure.

Referring to FIG. 16, in a semiconductor package according to embodiments of the present disclosure, a first semiconductor chip 1110 is electrically connected to a second substrate 1120.

In an embodiment, the first semiconductor chip 1110 is electrically connected to the second substrate 1120 through second solder balls 1162 disposed on a bottom surface 1120b of the second substrate 1120. The first semiconductor chip 1110 is spaced apart from a first substrate 1100 in the third direction DR3.

In an embodiment, a second semiconductor chip 1130 is disposed on an upper surface 1120a of the second substrate 1120. The second semiconductor chip 1130 is electrically connected to the first semiconductor chip 1110 through the second substrate 1120.

Hereinafter, a semiconductor package according to embodiments of the present disclosure will be described with reference to FIG. 17. A description will be given focusing on differences from a semiconductor package illustrated in FIG. 10.

Figure 17:
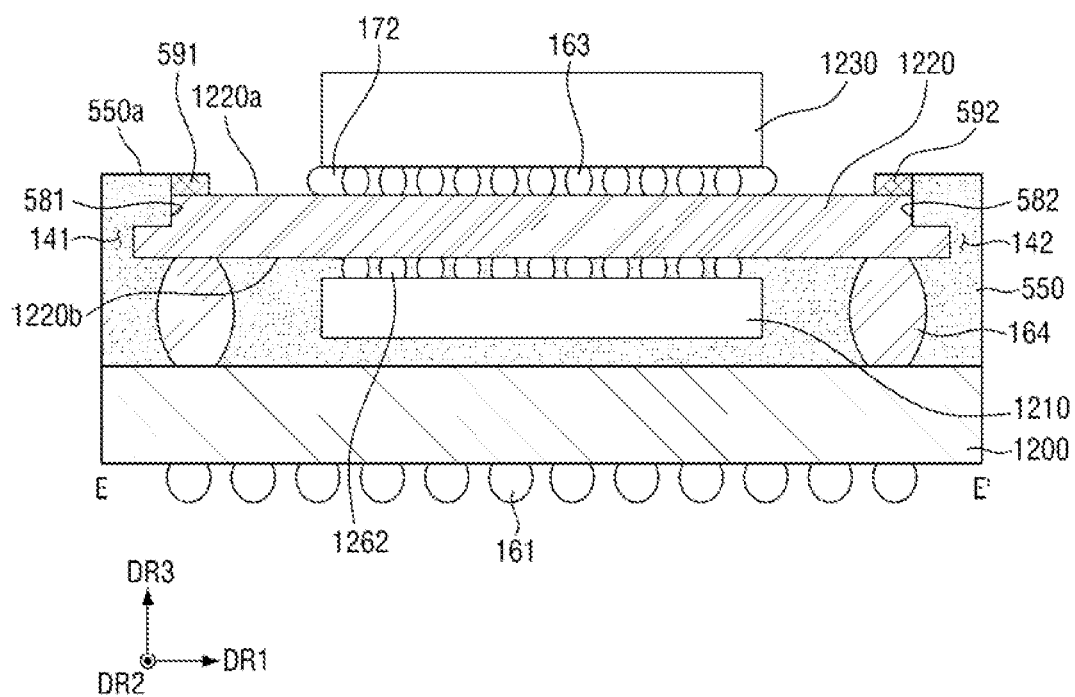
FIG. 17 is a cross-sectional view of a semiconductor package according to embodiments of the present disclosure.

FIG. 17 is a cross-sectional view of a semiconductor package according to embodiments of the present disclosure.

Referring to FIG. 17, in a semiconductor package according to embodiments of the present disclosure, a first semiconductor chip 1210 is electrically connected to a second substrate 1220.

In an embodiment, the first semiconductor chip 1210 is electrically connected to the second substrate 1220 through second solder balls 1262 disposed on a bottom surface 1220b of the second substrate 1220. The first semiconductor chip 1210 is spaced apart from a first substrate 1200 in the third direction DR3.

In an embodiment, a second semiconductor chip 1230 may be disposed on an upper surface 1220a of the second substrate 1220. The second semiconductor chip 1230 is electrically connected to the first semiconductor chip 1210 through the second substrate 1220.

Hereinafter, a method of fabricating a semiconductor package shown in FIG. 2 will be described with reference to FIGS. 2 and 18 to 23.

Figure 18:
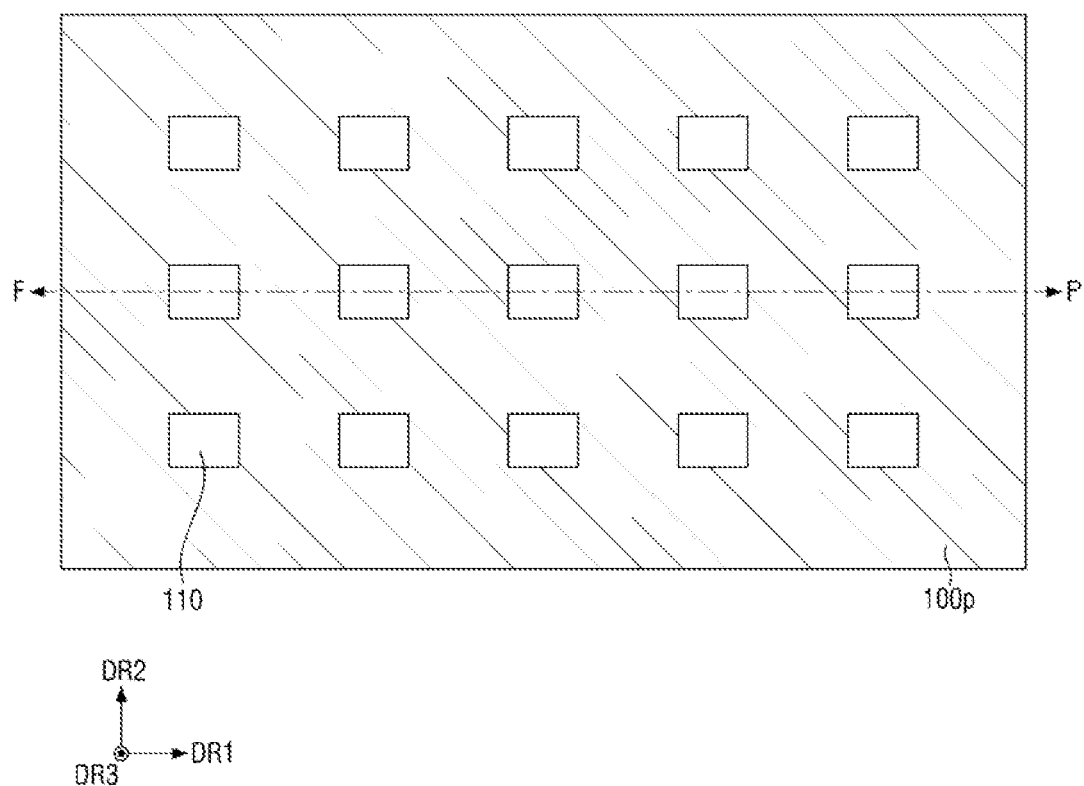
FIGS. 18 to 23 illustrate intermediate steps of a method of fabricating a semiconductor package shown in FIG. 2.
Figure 19:
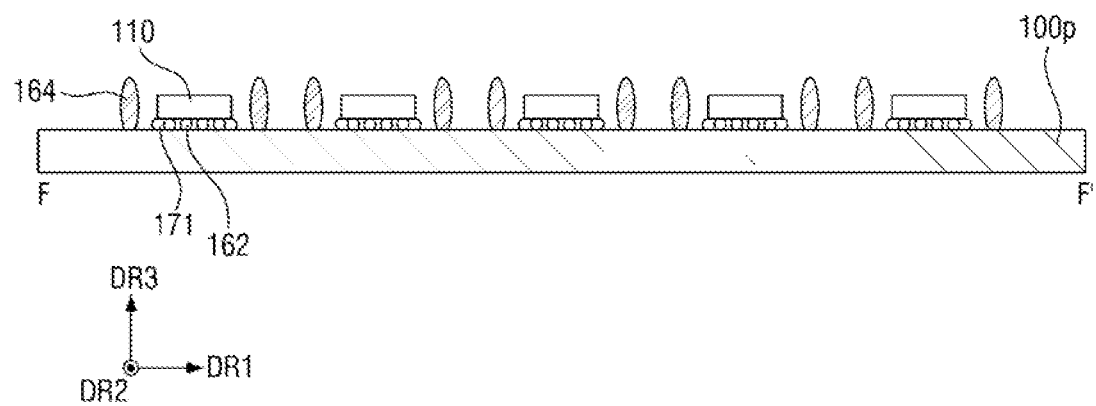
Figure 20:
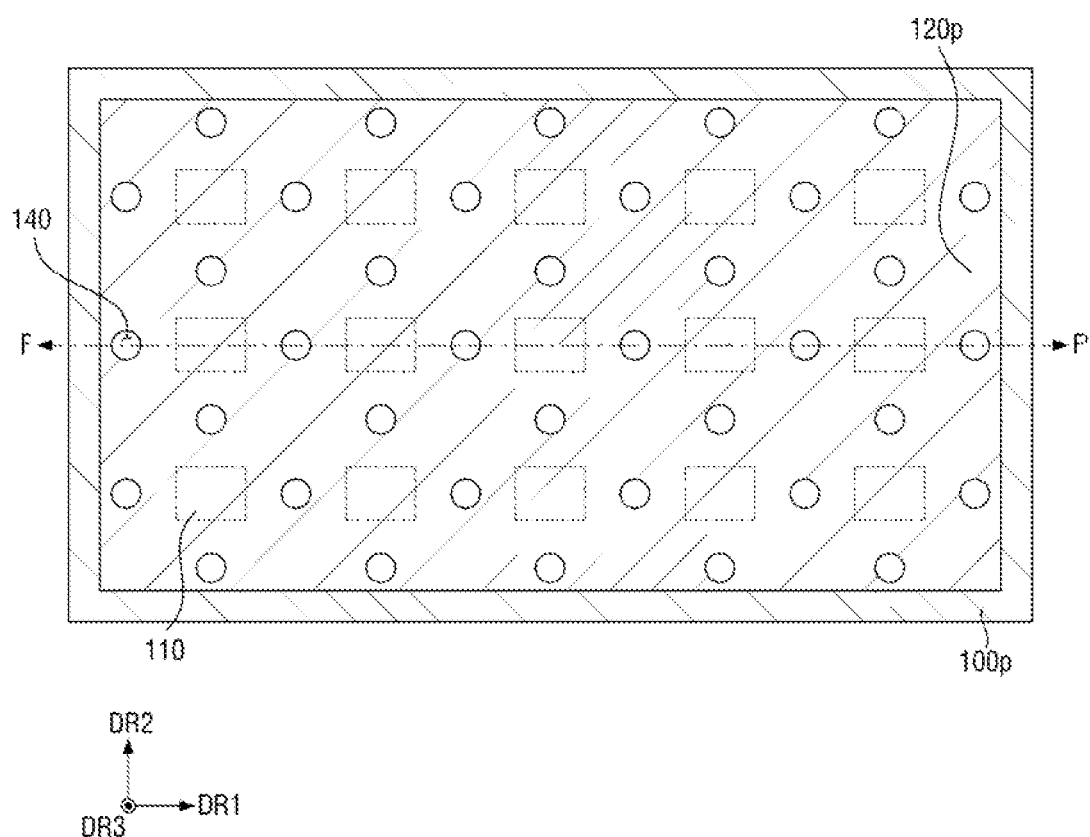
Figure 21:
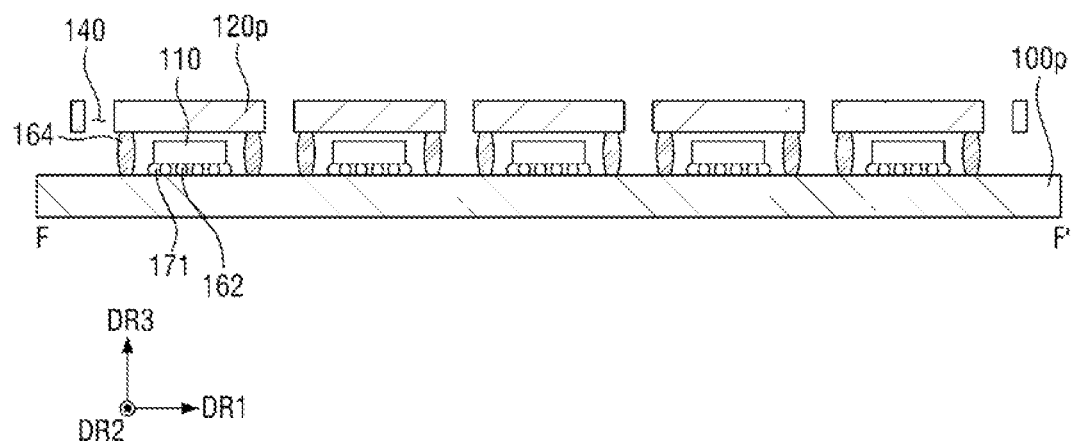
Figure 22:
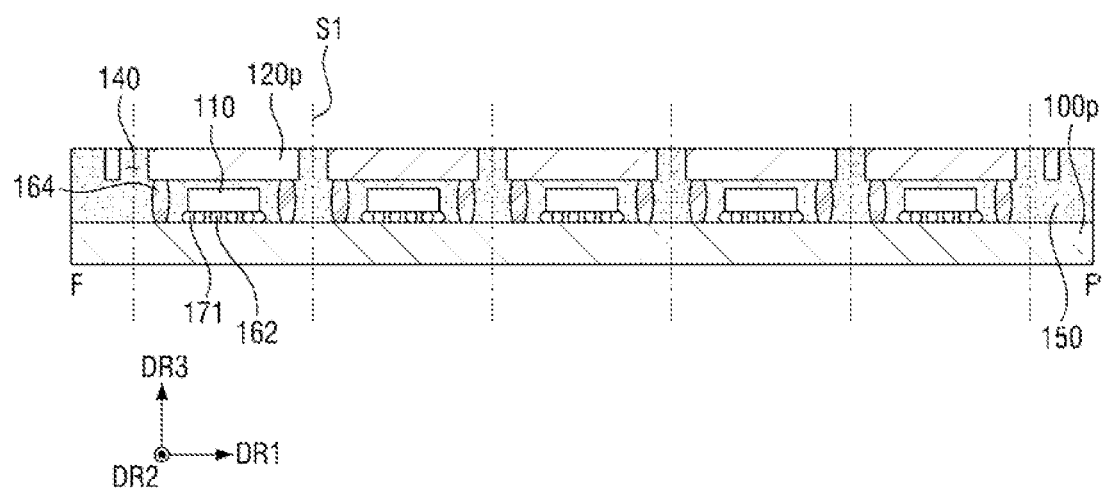

FIGS. 18 to 23 illustrate intermediate steps of a method of fabricating a semiconductor package shown in FIG. 2. FIG. 19 is a cross-sectional view taken along line F-F' of FIG. 18, FIGS. 21 and 22 are cross-sectional views taken along line F-F' of FIG. 20.

Referring to FIGS. 18 and 19, in an embodiment, a first substrate block 100p of a block unit is provided. Subsequently, a plurality of first semiconductor chips 110 are formed on the first substrate block 100p. The first semiconductor chips 110 are spaced apart from each other in the first direction DR1 and the second direction DR2.

In an embodiment, each of the first semiconductor chips 110 is electrically connected to the first substrate block 100p through the second solder balls 162. The first underfill material 171 is formed to surround the side surfaces of the second solder balls 162 between each of the first semiconductor chips 110 and the first substrate block 100.

In an embodiment, the fourth solder balls 164 are formed adjacent to the side surfaces of each of the first semiconductor chips 110. The fourth solder balls 164 are attached to the upper surface of the first substrate block 100p. The fourth solder balls 164 extend in the third direction DR3.

Referring to FIGS. 20 and 21, in an embodiment, a second substrate block 120p is formed on the first substrate block 100p.

In an embodiment, the fourth solder balls 164 are attached to the bottom surface of the second substrate block 120p. The second substrate block 120p is electrically connected to the first substrate block 100p through the fourth solder balls 164. The second substrate block 120p is formed to be spaced apart from the first semiconductor chip 110, but embodiments of the present disclosure are not necessarily limited thereto.

In an embodiment, the second substrate block 120p includes a plurality of holes 140 that penetrate the second substrate block 120p in the third direction DR3. The holes 140 are formed around each of the four side surfaces of each of the first semiconductor chips 110. The holes 140 and the first semiconductor chips 110 form a pattern in which the holes 140 and the first semiconductor chips 110 are alternately formed in each of the first direction DR1 and the second direction DR2.

FIGS. 20 and 21 illustrate that the planar size of the first substrate block 100p is greater than the planar size of the second substrate block 120p, but embodiments of the present disclosure are not necessarily limited thereto. In some embodiments, the planar size of the first substrate block 100p is the same as the planar size of the second substrate block 120p.

Referring to FIG. 22, the mold layer 150 is formed through the holes 140 in the second substrate block 120p.

In an embodiment, the mold layer 150 completely fills the space between the first substrate block 100p and the second substrate block 120p. Further, the mold layer 150 fills the holes 140 formed in the second substrate block 120p.

Figure 23:
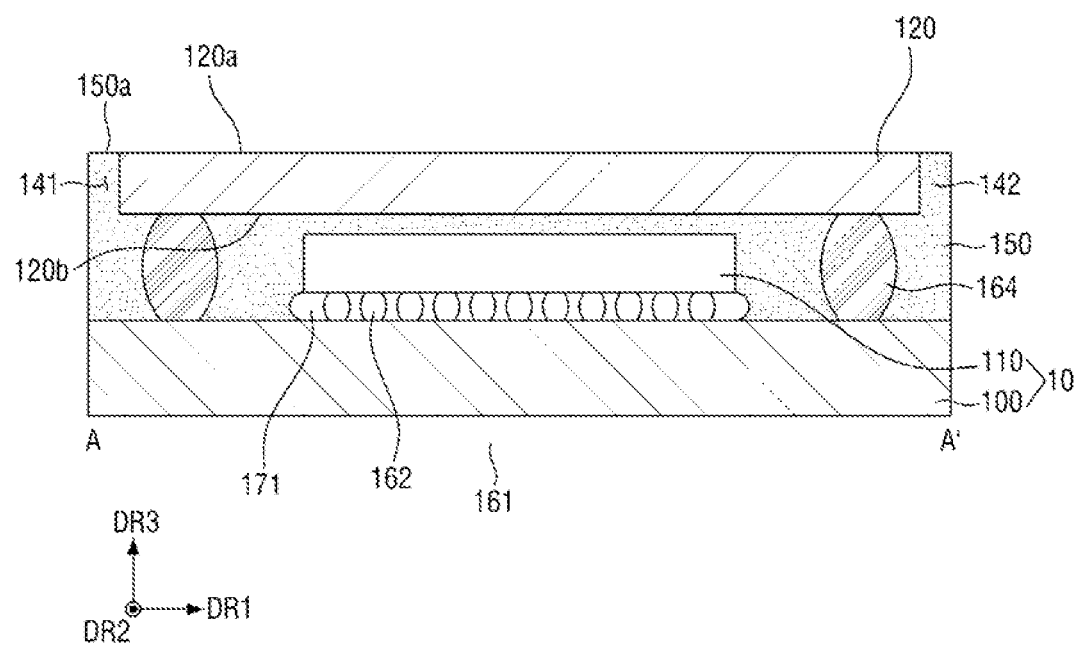

Referring to FIG. 23, in an embodiment, the first substrate block 100p, the mold layer 150 and the second substrate block 120p are cut along a plurality of first cutting lines S1, shown in FIG. 22. The first cutting lines S1 respectively overlap the holes 140 in the second substrate block 120p.

Subsequently, in an embodiment, the second semiconductor chip 130 is attached to the upper surface 120a of the second substrate 120. In addition, the third solder balls 163 and the second underfill material 172 are formed between the upper surface 120a of the second substrate 120 and the second semiconductor chip 130.

Thereafter, in an embodiment, the first solder balls 161 are formed on the bottom surface of the first substrate 100. The semiconductor package shown in FIG. 2 can be fabricated through the above-described steps.

Hereinafter, a method of fabricating a semiconductor package shown in FIG. 4 will be described with reference to FIGS. 4 and 24 to 27.

Figure 24:
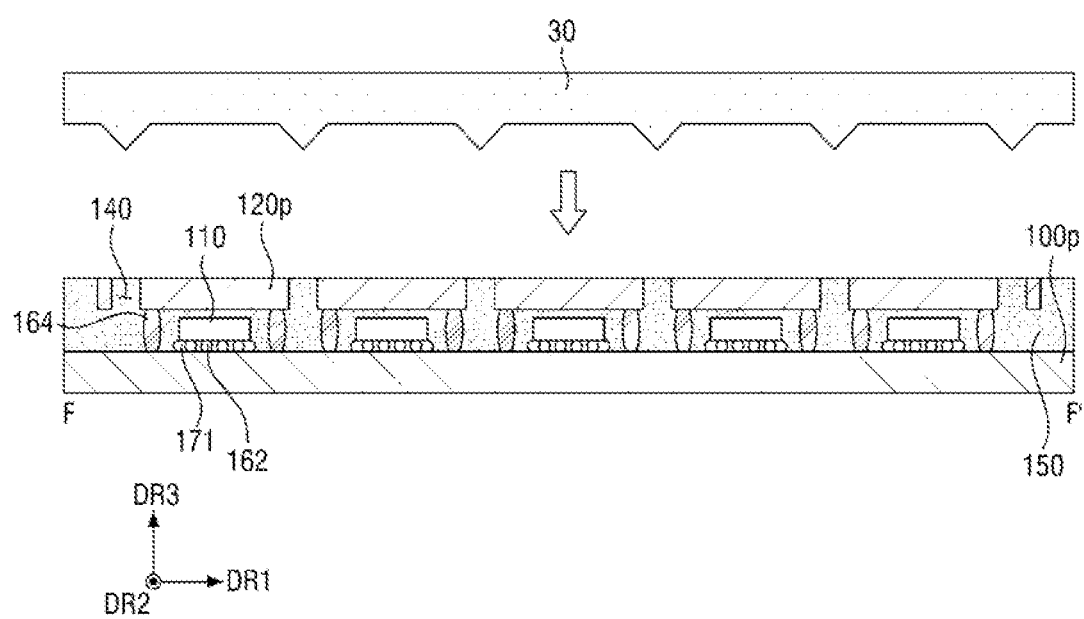
FIGS. 24 to 27 illustrate intermediate steps of a method of fabricating a semiconductor package shown in FIG. 4.

Referring to FIG. 24, in an embodiment, after the steps illustrated in FIGS. 18 to 22 are performed, a mold 30 is provided on the second substrate block 120p and the mold layer 150. The bottom surface of the mold 30 is provided with protrusions formed at positions that correspond to the holes 140 formed m the second substrate block 120p.

Figure 25:
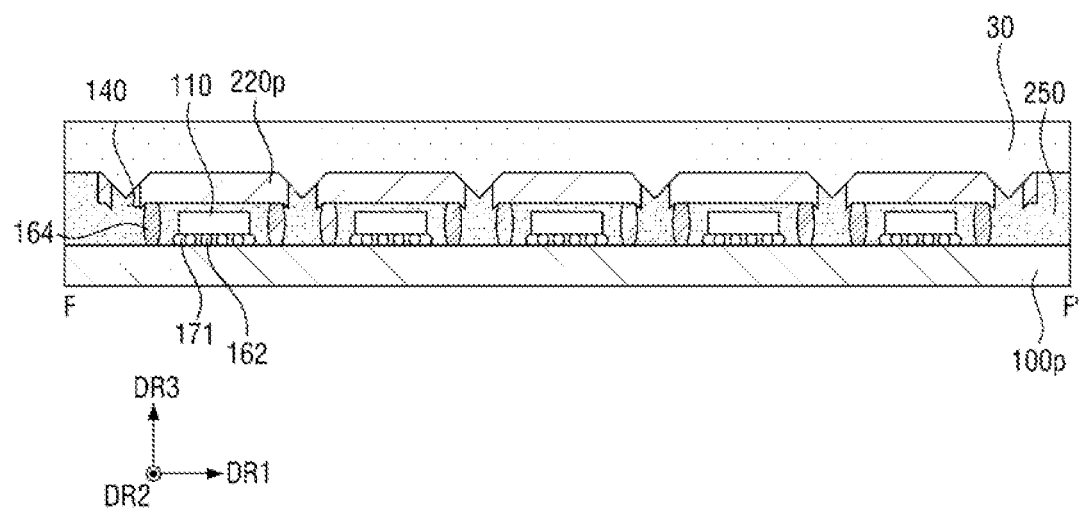

Referring to FIG. 25, in an embodiment, the second substrate block 120p and the mold layer 150 are compressed using the mold 30. Through a compressing process that uses the mold 30, a second substrate block 220p and a mold layer 250 are formed to have inclined profiles on the upper surfaces thereof.

Figure 26:
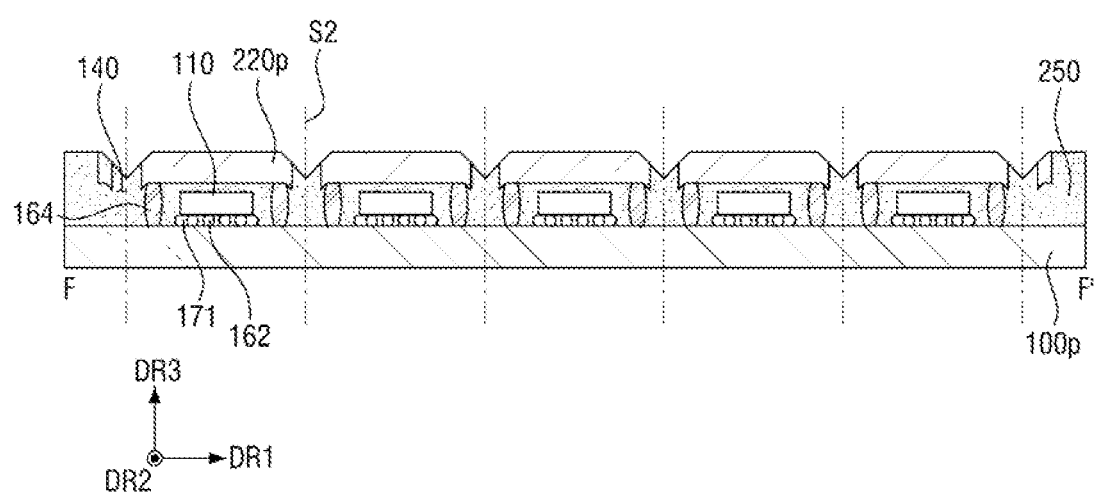
Figure 27:
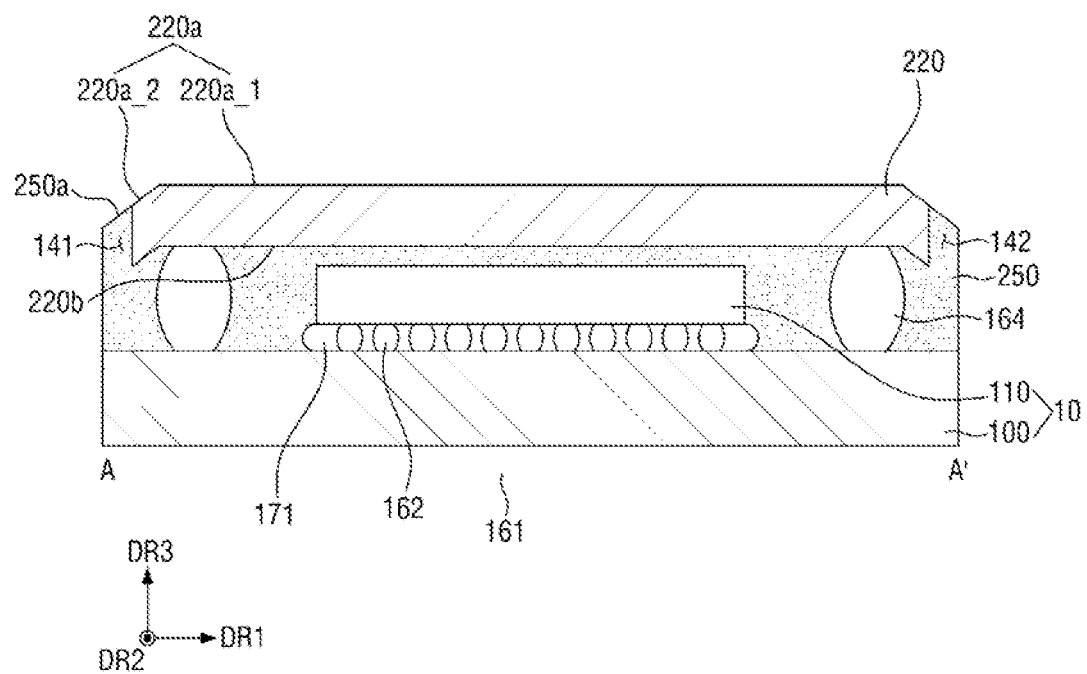

Referring to FIGS. 26 and 27, in an embodiment, the first substrate block 100p, the mold layer 250 and the second substrate block 220p are cut along a plurality of second cutting lines S2. The second cutting lines S2 respectively overlap the holes 140 formed in the second substrate block 220p.

Subsequently, in an embodiment, the second semiconductor chip 130 is attached to the upper surface 220a of the second substrate 220. In addition, the third solder balls 163 and the second underfill material 172 are formed between the upper surface 270a of the second substrate 220 and the second semiconductor chip 130.

Thereafter, in an embodiment, the first solder balls 161 are formed on the bottom surface of the first substrate 100. The semiconductor package shown in FIG. 4 can be fabricated through the above-described steps.

In concluding the detailed description, those skilled in the an will appreciate that many variations and modifications can be made to exemplary embodiments without substantially departing from the principles of the present disclosure. Therefore, exemplary embodiments of the present disclosure are used in a generic and descriptive sense only and not for purposes of limitation.

What is claimed is:

1. A semiconductor package, comprising:
   a first substrate;
   a first semiconductor chip disposed on the first substrate;
   a second substrate disposed on the first semiconductor chip, wherein the second substrate includes a recess formed at an edge;
   a second semiconductor chip disposed on the second substrate; and
   a mold layer disposed between the first substrate and the second substrate, wherein the mold layer fills the recess,
   wherein the recess protrudes concavely inward from the edge of the second substrate toward a center of the second substrate, when viewed in a plan view, and
   wherein a side surface of the mold layer disposed inside the recess and a side surface of the second substrate are aligned in a direction perpendicular to art upper surface of the second substrate.

2. The semiconductor package of claim 1, wherein a level of an uppermost surface of the mold layer in the recess is higher than a level of a bottom surface of the second substrate.

3. The semiconductor package of claim 2, wherein the uppermost surface of the mold layer in the recess is coplanar with the upper surface of the second substrate.

4. The semiconductor package of claim 1, wherein the upper surface of the second substrate comprises a first upper surface that is parallel to a lower surface of the second semiconductor chip, and a second upper surface connected to an edge of the first upper surface, and
   wherein the second upper surface of the second substrate is parallel to an inclined plane that is inclined with respect to the first upper surface of the second substrate.

5. The semiconductor package of claim 1, further comprising:
   a trench formed at the edge of the second substrate, wherein the trench penetrates into the second substrate in a thickness direction and protrudes concavely inward toward the center of the second substrate,
   wherein the trench surrounds the recess.

6. The semiconductor package of claim 5, wherein a level of a bottom surface of the trench is higher than a level of a bottom surface of the recess.

7. The semiconductor package of claim 1, further comprising:
   a dam formed at the edge of the second substrate, wherein the dam protrudes upward from the upper surface of the second substrate, and a side surface of the dam contacts the mold layer.

8. The semiconductor package of claim 7, wherein an upper surface of the dam is coplanar with an uppermost surface of the mold layer.

9. The semiconductor package of claim 7, wherein a height of the dam with respect to the upper surface of the second substrate ranges from 10 μm to 50 μm.

10. The semiconductor package of claim 1, wherein the first semiconductor chip is electrically connected to the first substrate, and the second semiconductor chip is electrically connected to the second substrate.

11. The semiconductor package of claim 1, wherein each of the first semiconductor chip and the second semiconductor chip is electrically connected to the second substrate.

12. The semiconductor package of claim 1, wherein a width of the recess in a direction along the edge of the second substrate ranges from 50 μm to 500 μm.

13. A semiconductor package, comprising:
   a first semiconductor package that includes a first substrate and a first semiconductor chip electrically connected to the first substrate;
   a second semiconductor package disposed on the first semiconductor package, wherein the second semiconductor package includes a second substrate that includes a recess formed at an edge and a second semiconductor chip electrically connected to the second substrate formed; and
   a mold layer disposed between the first semiconductor package and the second semiconductor package, wherein the mold layer fills the recess,
   wherein a level of an uppermost surface of the mold layer in the recess is higher than a level of a bottom surface of the second substrate, and wherein the mold layer does not cover the second semiconductor chip, and
   wherein a side surface of the mold layer disposed inside the recess and a first side surface of the second substrate are aligned in a direction perpendicular to an upper surface of the second substrate.

14. The semiconductor package of claim 13,
wherein the recess protrudes concavely inward from the edge of the second substrate toward a center of the second substrate, and wherein the recess comprises:
a first recess formed on the first side surface of the second substrate; and
a second recess formed on a second side surface of the second substrate opposite to the first side surface of the second substrate.

15. The semiconductor package of claim 13, wherein the uppermost surface of the mold layer in the recess is coplanar with the upper surface of the second substrate.

16. The semiconductor package of claim 13, wherein the upper surface of the second substrate comprises a first upper surface that is parallel to a lower surface of the second semiconductor chip, and a second upper surface connected to an edge of the first upper surface, and
wherein the second upper surface of the second substrate is parallel to an inclined plane that is inclined with respect to the first upper surface of the second substrate.

17. The semiconductor package of claim 13, further comprising:
a trench formed at the edge of the second substrate, wherein the trench penetrates into the second substrate in a thickness direction and protrudes concavely inward toward the center of the second substrate,
wherein the trench surrounds the recess.

18. The semiconductor package of claim 13, further comprising:
a dam formed at the edge of the second substrate, wherein the dam protrudes upward from the upper surface of the second substrate, and a side surface of the dam contacts with the mold layer.

19. A semiconductor package, comprising:
a first substrate;
a first semiconductor chip disposed on the first substrate, wherein the first semiconductor chip is electrically connected to the first substrate;
a second substrate disposed on the first semiconductor chip, wherein the second substrate includes a first recess formed on a first corner thereof and a second recess formed on a second corner opposite to the first corner;
a second semiconductor chip disposed on the second substrate, wherein the second semiconductor chip is electrically connected to the second substrate;
a solder ball disposed between the first substrate and the second substrate, wherein the solder ball electrically connects the first substrate to the second substrate; and
a mold layer disposed between the first substrate and the second substrate, wherein the mold layer surrounds the first semiconductor chip and the solder ball, and the mold layer fills each of the first and second recesses,
wherein each of the first and second recesses protrudes concavely inward from its respective corner of the second substrate toward a center of the second substrate, when viewed in a plan view,
wherein a level of an uppermost surface of the mold layer in each of the first, and second recesses is higher than a level of a bottom surface of the second substrate, and where the mold layer does not cover the second semiconductor chip, and
wherein a side surface of the mold layer disposed inside the first recess and a side surface of the second substrate are aligned in a direction perpendicular to an upper surface of the second substrate.

20. The semiconductor package of claim 19, further comprising:
a dam formed at the edge of the second substrate, wherein the dam protrudes upward from the upper surface of the second substrate, and the dam contacts with the mold layer.

* * * * *